United States Patent [19]
Shiau et al.

[11] Patent Number: 5,805,501
[45] Date of Patent: Sep. 8, 1998

[54] FLASH MEMORY DEVICE WITH MULTIPLE CHECKPOINT ERASE SUSPEND LOGIC

[75] Inventors: Tzeng-Huei Shiau, Hsin-Pu, Taiwan; Ray-Lin Wan, Fremont, Calif.; Weitong Chuang, Taichung; Yu-Sui Lee, Kaoshiung, both of Taiwan; Kong Mou Liou, San Jose, Calif.

[73] Assignee: Macronix International Co., Ltd., Hsinchu, Taiwan

[21] Appl. No.: 718,341
[22] PCT Filed: May 22, 1996
[86] PCT No.: PCT/US96/07491
 § 371 Date: Oct. 3, 1996
 § 102(e) Date: Oct. 3, 1996
[87] PCT Pub. No.: WO97/44792
 PCT Pub. Date: Nov. 27, 1997

[51] Int. Cl.⁶ .................................................. G11C 16/04
[52] U.S. Cl. ........................... 365/185.29; 365/185.33; 365/218; 395/430
[58] Field of Search ................ 365/185.11, 185.29, 365/185.33, 218; 395/430

[56] References Cited

U.S. PATENT DOCUMENTS

| | | | |
|---|---|---|---|
| 5,243,575 | 9/1993 | Sambandan et al. | 365/233.05 |
| 5,245,570 | 9/1993 | Fazio et al. | 365/185.13 |
| 5,297,096 | 3/1994 | Terada et al. | 365/185.11 |
| 5,333,300 | 7/1994 | Fandrich | 395/430 |
| 5,341,330 | 8/1994 | Wells et al. | 365/185.33 |
| 5,345,416 | 9/1994 | Nakagawara | 365/185.13 |
| 5,355,464 | 10/1994 | Fandrich et al. | 365/218 |
| 5,379,413 | 1/1995 | Hazen et al. | 371/21.2 |
| 5,414,664 | 5/1995 | Lin et al. | 365/185.22 |
| 5,414,829 | 5/1995 | Fandrich et al. | 395/428 |
| 5,448,712 | 9/1995 | Kynett et al. | 395/430 |
| 5,463,757 | 10/1995 | Fandrich et al. | 395/430 |
| 5,596,530 | 1/1997 | Lin et al. | 365/185.29 |

*Primary Examiner*—David C. Nelms
*Assistant Examiner*—Hoai Ho
*Attorney, Agent, or Firm*—Mark A. Haynes; Wilson, Sonsini, Goodrich & Rosati

[57] ABSTRACT

A flash memory device includes a multiple checkpoint erase suspend algorithm. A user may issue an erase suspend command at anytime during an erase process. The erase procedure is suspended as fast as possible by allowing the erase procedure to be suspended at the first to occur of a plurality of checkpoints in the process. The block erase procedure includes a precondition phase (also called a pre-programming phase), in which a selected block is pre-programmed by applying a program potential, and then the pre-programming of the block is verified on a byte-by-byte basis. After the precondition phase, an erase phase is executed in which the selected block is erased by applying an erase potential to the block, and then verifying the erasing of the block. Erase suspend logic is coupled to the erase logic and executes an erase suspend procedure which interrupts the block erase procedure after receiving the erase suspend command during the first to occur of a set of checkpoints in the block erase procedure. The set of checkpoints comprises a first checkpoint enabling the interrupting during the precondition phase, a second checkpoint enabling the interrupting during the application of the erase potential, a third checkpoint enabling the interrupting during the verifying of the erasing step, a fourth checkpoint between the precondition phase and the erase phase, and a fifth checkpoint after the erase pulse and before verifying the erase of the block. After interrupting the block erase procedure, the erase suspend procedure includes returning to the block erase procedure to complete the block erase.

40 Claims, 14 Drawing Sheets

FIG.11A

PROGRAM TIMING SEQUENCE:
PROGRAM
PROGRAM RECOVERY
TPGMREC1
TPRCEND
PROGRAM VERIFY
TPGMREC2
PROGRAM VERIFY RECOVERY

FIG.11B

Erase Suspend @ check point A Timing Sequence:
PROGRAM
PROGRAM RECOVERY
TPGMREC
TPRCEND
ERASE SUSPEND
ERASE SUSPEND READY
PROGRAM VERIFY
PROGRAM VERIFY RECOVERY

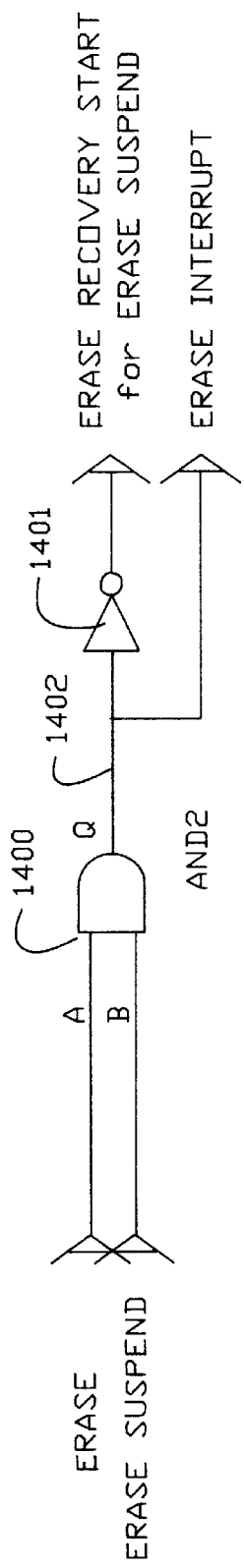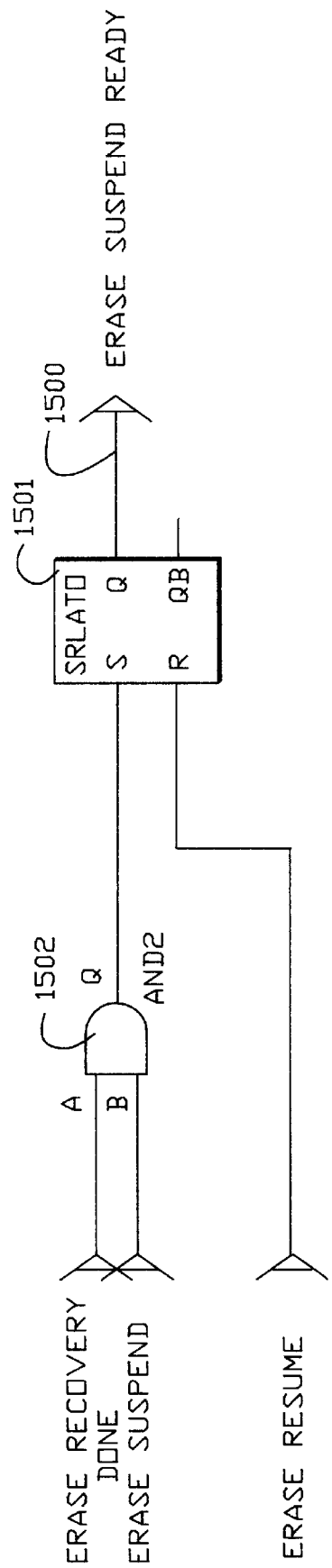

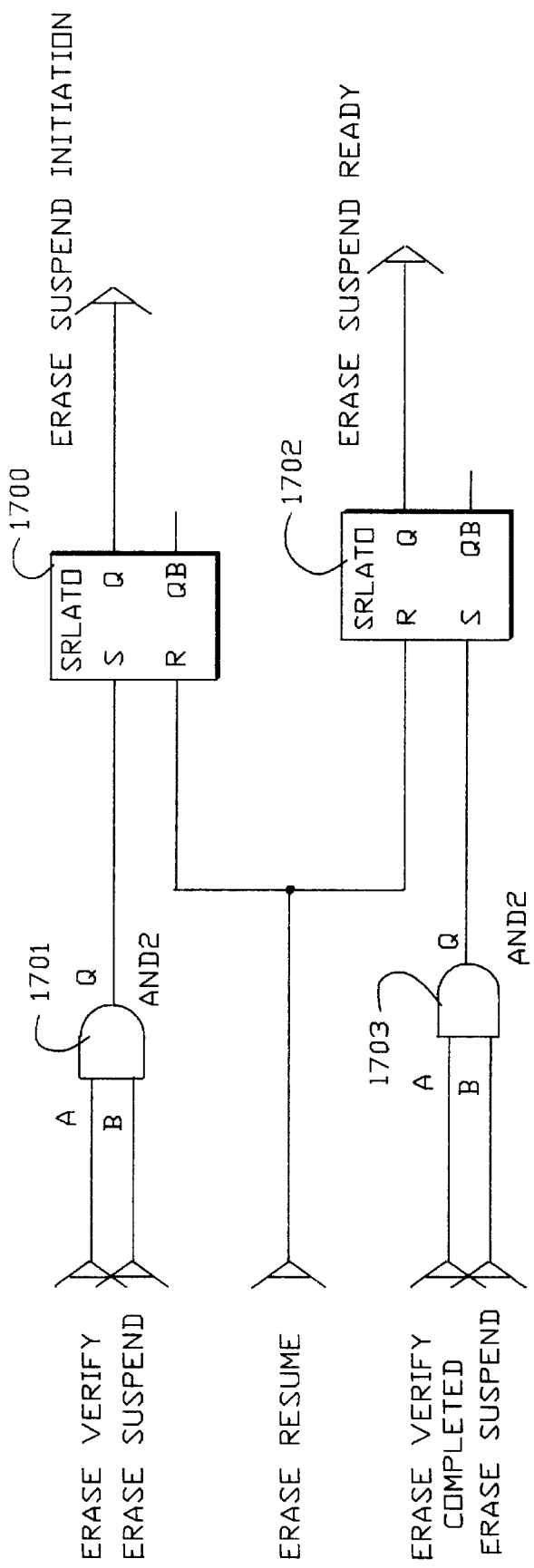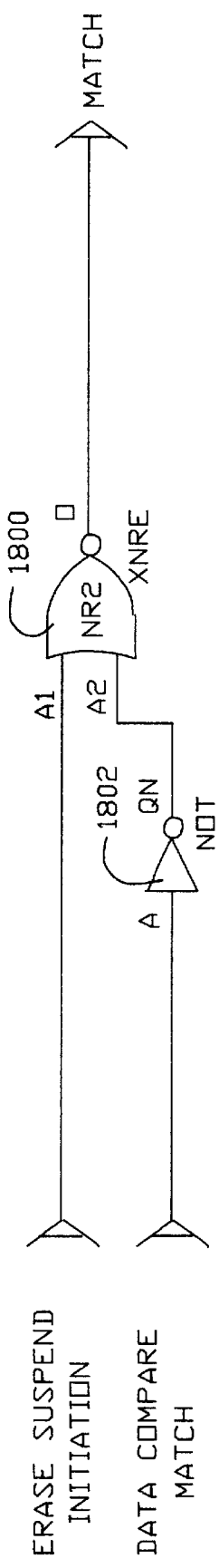

FLASH MEMORY DEVICE WITH MULTIPLE CHECKPOINT ERASE SUSPEND LOGIC

BACKGROUND OF THE INVENTION

1. Field of the Invention

The present invention relates to the field of nonvolatile semiconductor memories, and more particularly to processes for suspending an automated erase sequence of a flash memory device.

2. Description of Related Art

A flash memory device is based on a memory array of floating gate transistors which are organized into a plurality of blocks of memory cells in many current architectures, in order to support block by block programming and erasing of the array of cells. See U.S. Pat. No. 5,414,664; entitled FLASH EPROM WITH BLOCK ERASE FLAGS FOR OVER-ERASE PROTECTION; invented by Lin, et al. For a typical flash memory cell, a logic "1" corresponds to an erased state, in which fewer electrons are stored in the floating gate of the cell, and therefore the erased cell has a low threshold. When a read voltage is applied to the control gate of the cell which has been erased, then the cell is conductive. On the other hand, a logic "0" corresponds to a programmed state, in which the floating gate has more electrons stored in it. In the programmed state, the cell has a high threshold, such that upon application of a read potential to the word line, the cell is not conductive. (Of course, the logic values of the programmed and erased states can be assigned however best suits a given implementation). Flash memory cells are characterized by the fact that a single memory cell cannot be over written from the logic 0 or programmed state to the logic 1 or erased state, on a bit-by-bit basis. Thus, in order to set a cell to a desired state, the entire block must be erased first, and then those cells which are intended to have the logic 0 stored in them, are individually programmed.

The erase procedure is typically automatically controlled by an internal state machine on the device. This procedure takes relatively a long time. For example, prior art erase procedures consist of a number of steps including pre-programming and verifying the pre-programming of all the bytes in the block, and erasing the entire block followed by verification of the erase of all the bytes in the block.

It may happen that during an erase procedure, a user will desire to read data stored in blocks other than the one that is being erased. In order to accomplish a read, it is desirable to suspend the ongoing erase procedure, allow the read access to proceed, and then resume the erase procedure after the read access is complete.

One prior art erase suspend process is described in prior art U.S. Pat. No. 5,355,464; entitled CIRCUITRY AND METHOD FOR SUSPENDING THE AUTOMATED ERASURE OF A NON-VOLATILE SEMICONDUCTOR MEMORY; invented by Fandrich, et al. As described in the Fandrich, et al. patent, the erase suspend command may be issued by the user at any time. However, the erase procedure according to Fandrich, et al. can only be suspended at certain places in the erase procedure (See, FIG. 5 of Fandrich, et al). For example, during the preconditioning phase of the erase procedure (during which pre-programming is done), the state machine responds to the erase suspend command only after successful pre-programming of a current byte being pre-programmed. To pre-program a byte, a program pulse is applied to the byte, and then a verification test is executed. If the verify fails, then another program pulse is applied and the verification is retried. This pulse and verify loop can continue for a number of cycles until the byte is successfully programmed, or the algorithm fails. By requiring a user to wait until a successful pre-programming has been accomplished for the current byte subject of the pre-programming procedure, significant delays are encountered by the user in attempting to make an access to another block in the array during the erase process.

In Fandrich, et al., a second point at which the erase procedure responds to a suspend command is during the erase phase of the process. In Fandrich, et al., the erase phase involves a relatively long erase pulse (on the order of milliseconds) which is applied. After the erase pulse, then the block is subject to an erase verify process on a byte-by-byte basis. According to Fandrich, et al., the erase procedure cannot be suspended until after the entire erase pulse is over. This approach is obviously disadvantageous because it can take a significant amount of time between the time the erase suspend command is issued, and the state machine can actually be suspended to allow the user to make an access to another block.

In high performance processing systems, the delay in access to data stored in a flash memory device can be critical. Thus, it is desirable to speed up the suspend process during erase procedure as much as possible.

SUMMARY OF THE INVENTION

The present invention provides a flash memory device which includes a multiple checkpoint erase suspend algorithm. A user may issue an erase suspend command at anytime during an erase process. According to the present invention, the erase procedure is suspended as fast as possible by allowing the erase procedure to be suspended at the first to occur of a plurality of checkpoints. The checkpoints are chosen in order to minimize the amount of time that a user must wait between issuing of erase suspend command, and executing an access to the memory array during suspension of the erase.

Accordingly, the present invention can be characterized as an integrated circuit memory such as a flash memory integrated circuit, which includes a memory array composed of a plurality of blocks of memory cells. Block erase logic is coupled to the memory array which executes a block erase procedure to erase selected blocks of memory cells in response to a block erase command. The block erase procedure includes a precondition phase (also called a pre-programming phase), in which a selected block is pre-programmed by applying a program potential, and then the pre-programming of the block is verified. Typically the pre-programming and pre-program verifying is executed on a multiple bit segment by multiple bit segment (such as byte-by-byte) basis. After the precondition phase, an erase phase is executed in which the selected block is erased by applying an erase potential to the block, and then the selected block is tested to verify the erasing of the block. According to the present invention, erase suspend logic is coupled to the erase logic and executes an erase suspend procedure to suspend the block erase procedure in response to an erase suspend command. The erase suspend procedure includes interrupting the block erase procedure after receiving the erase suspend command during a checkpoint, usually the first to occur, of a set of checkpoints in the block erase procedure, where a checkpoint is an interval of time in the procedure which may fall between events in the procedure, or encompass one or more events in the procedure. The set of checkpoints comprises a first checkpoint enabling the interrupting during the precondition phase, a second checkpoint enabling the interrupting during the erase pulse, that is the application of the erase potential to the block, and a third checkpoint enabling the interrupting during the verifying of the erasing step. After interrupting the block erase procedure, the erase suspend procedure includes returning to the block erase procedure to complete the block erase.

As mentioned above, blocks in the plurality of blocks include a plurality of bytes of data. The precondition phase includes logic to pre-program a selected block on a byte-by-byte basis. This logic sequentially applies a program potential to a byte, and then verifies the pre-programming of the byte before proceeding to apply the program potential to a next byte in the block. This sequential process is executed until the block is pre-programmed or an error occurs. According to one aspect of the invention, the first checkpoint is between the pre-programming of bytes in the block. More specifically, according to one preferred embodiment of the present invention, the first checkpoint enables the interrupting of the block erase procedure after application of a program potential to a byte in the block, and before the verification of the programming of the same byte. Thus, the algorithm of the present invention allows the erase procedure to be interrupted at the end of a pre-program pulse after the suspend command is issued, regardless of whether the byte subject of the pre-program pulse has been successfully pre-programmed.

According to another aspect of the invention, the second checkpoint in the erase suspend procedure is during the application of an erase pulse. If a suspend command is issued during the time that an erase pulse is being applied to flash memory cells, or before the erase pulse is activated, the erase procedure will be interrupted immediately. In general, an erase pulse is relatively long and is much longer than a pre-program pulse. For example, an erase pulse may be on the order of 10 milliseconds for erasing a block of memory cells, versus on the order 10 microseconds for the pre-program pulse. Thus, it is useful for the state machine to be able to suspend during application of an erase potential of an erase pulse to reduce the response time and increase the efficiency of the suspend algorithm.

According to yet another aspect of the invention, the third checkpoint occurs during the erase verification stage. If the suspend command is issued during erase verification, the state machine forces erase verification to fail and quickly exits from this stage.

According to yet another aspect of the invention, the erase suspend logic of the present invention is coupled with a segmentable flash architecture based on local bit lines and local source lines which are interconnected to global bit lines through block select transistors. The combination of the unique architecture with the erase suspend process provides for an efficient high speed integrated circuit memory device, capable of responding to an erase suspend command very efficiently.

According to yet another aspect of the present invention, the block erase logic includes a plurality of block erase flags, one flag for each block in the plurality of blocks. The block erase procedure includes setting the block erase flags for blocks selected to be erased. If a block is successfully erased, then the block erase flag for the block is reset during the erase verification stage. This way, only blocks which fail erase verify are subject to a retry of the erase pulse. (See U.S. Pat. No. 5,414,664, cited above.) According to this aspect of the invention, when the erase suspend command is received during erase verification, erase verification is forced to fail and the erase flag for current block is not reset. The control logic then jumps to a next block. If the erase flag of the next block is not set, then it is skipped. On the other hand if the erase flag is set, then the erase verification again is forced to fail. This prevents resetting of the flag, and the state machine proceeds through the plurality of block erase flags until all of the remaining flags have processed. After the resume command is issued, the erase verification procedure resumes at the beginning of the first byte in the first block by monitoring the block erase flag for the block. On the other hand, the erase retry counter is not reset nor increased during the erase suspend flow. In this way, the number of retry counts can be correctly kept even with the erase suspend process being executed in the middle of the block erase procedure.

Accordingly, a flash memory device with erase suspend logic is provided which is capable of suspending the erase procedures as quickly as possible after issuing of the erase suspend command by the user. This enables much more efficient use of flash memory devices than is possible in the prior art.

Other aspects and advantages of the present invention can be seen upon review of the figures, the detailed description and the claims which follow.

BRIEF DESCRIPTION OF THE FIGURES

FIGS. 9, 10 and 11A–11B are simplified logic diagrams and a timing diagram illustrating the erase suspend operation corresponding to block 504 of FIG. 5.

FIGS. 12, 13, 14, 15 and 16A–16B illustrated logic and timing for generating the ERASE SUSPEND READY signal during the checkpoint at block 601 of FIG. 6.

FIGS. 17 and 18 illustrate logic for erase suspend process at the checkpoint block 606 of FIG. 6

DETAILED DESCRIPTION

A detailed description of preferred embodiments of the present invention is provided with reference to the figures.

Figure 1:
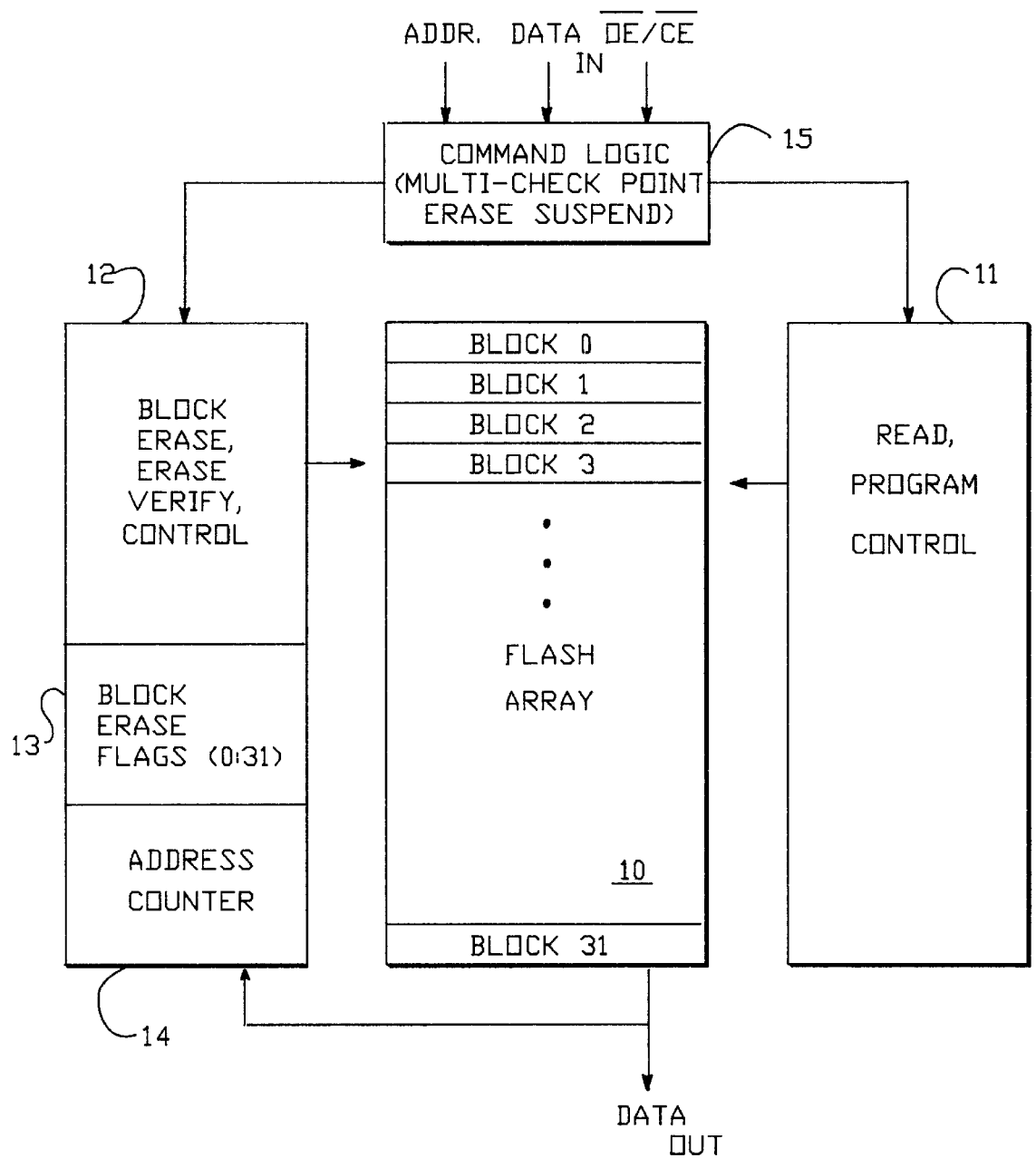
FIG. 1 is a simplified block diagram of a flash memory device including the multiple checkpoint erase suspend logic of the present invention.

FIG. 1 shows the basic structure of a flash memory integrated circuit incorporating the present invention. The circuit includes a flash memory array, generally 10, which is divided into a plurality of blocks (32 blocks in the figure). The flash memory array has a segmentable architecture such as that shown in FIG. 2 or FIG. 3 described below.

Coupled with the array 10 are a read and program control circuit 11 and a block erase and erase verify control circuit 12. The block erase and erase verify control circuit 12 includes a plurality of block erase flags 13 and an address counter 14 for incrementing through memory cells for the erase verify sequence.

The chip includes command logic 15 which is coupled to the address, data, and other control lines, such as the output enable and chip enable signals. The command logic 15 interprets inputs to set a mode of operation for the read and program control logic 11 and the block erase and erase verify control logic 12. The command logic 15 according to the present invention includes logic for recognizing and executing a multiple checkpoint erase suspend process.

Command logic 15 may be implemented as done in standard flash memory integrated circuits, such as the Am28F020 flash memory chip manufactured by Advanced Micro Devices, Inc. of Sunnyvale, Calif., with the additional commands according to the present invention for block erase and erase suspend. In response to commands issued by the command logic 15, and embedded block erase operation is executed by state machines in the block erase and erase verify control logic 12. The user, through a host CPU or otherwise, supplies address and data signals to the command logic 15 to indicate a preferred mode of operation. The modes relevant to the present invention include a chip erase mode in which all blocks in the array 10 are to be erased, and a block erase mode in which selected blocks in the array 10 are to be erased. Blocks to be erased are identified by the block erase flags 13. The chip and block erase modes include multiple checkpoints at which erase suspend is effective, as described in detail below.

Because of the architecture of the flash memory array 10, the blocks within the array are segmentable for the erase operation. An understanding of the array as shown in FIG. 2 demonstrates how the block erase operation may be executed by the control logic.

Figure 2:
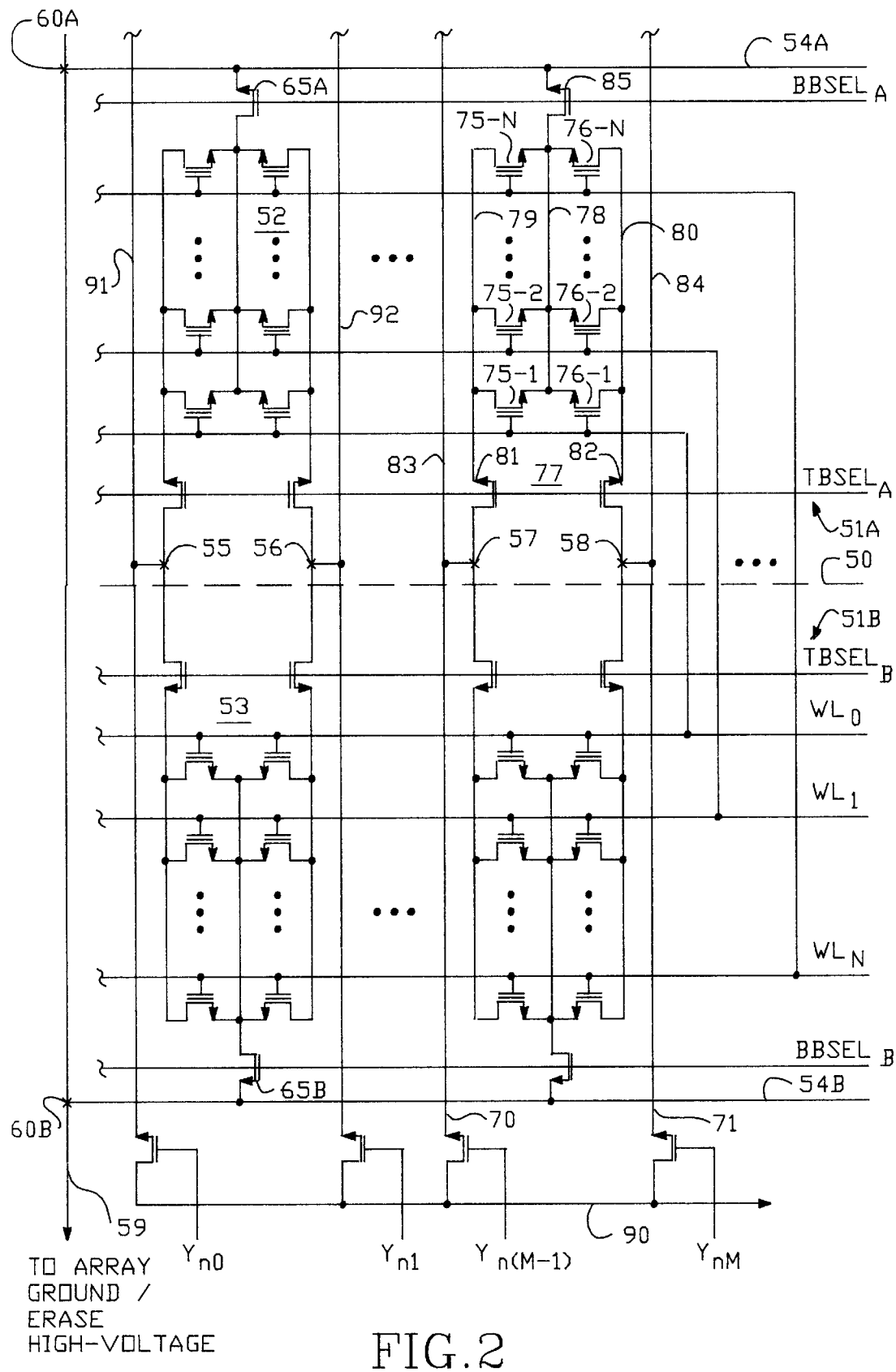
FIG. 2 is a circuit diagram illustrating one preferred integrated circuit memory architecture for use in the system of FIG. 1.

FIG. 2 illustrates a segmentable array architecture, using a drain-source-drain configuration of the flash memory circuit, as described in U.S. Pat. No. 5,399,891; invented by Yiu, et al.

The circuit includes segmentable sections (e.g. section 77) of the array including a first local bit line 79 and a second local bit line 80. The first and second local bit lines 79, 80 are implemented by buried diffusion conductors. Also included is a local virtual ground line 78 implemented by buried diffusion. A plurality of floating gate transistors having gates, drains and sources are coupled to the local bit lines 79, 80 and local virtual ground line 78. The sources of the plurality of transistors are coupled to the local virtual ground line 78. The drains of a first column of transistors, 75-1 to 75-N, are coupled to the first local bit line 79, and the drains of a second column of transistors, 76-1 to 76-N, are coupled to the second local bit line 80. The gates of the floating gate transistors are coupled to word lines $WL_0$ through $WL_N$, where each word line (e.g., $WL_1$) is coupled to the gate of a transistor (e.g., transistor 75-2) in the first local bit line 79 and a transistor (e.g., transistor 76-2) in the second local bit line 80. Thus, transistors 75-2 and 76-2 can be considered a two transistor cell with a shared source diffusion.

The act of charging the floating gate is called the program step for the memory cell. This is accomplished on a byte-by-byte basis through hot electron injection by establishing a large positive voltage between the gate and the source, such as twelve volts, and a positive voltage between the drain and the source, such as six volts.

The act of discharging the floating gate is called the erase step for the memory cell. This is accomplished through F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate. F-N tunneling may also be used for the program step.

A first global bit line 83 and a second global bit line 84 are associated with each drain-source-drain block. The first global bit line 83 is coupled to the source of top block select transistor 81 through a metal-to-diffusion contact 57. Similarly, the second global bit line 84 is coupled to the source of top block select transistor 82 through a metal-to-diffusion contact 58. The drains of the top block select transistors 81, 82 are coupled to the first and second local bit lines 83 and 84, respectively. The gates of the top block selector transistors 81, 82 are controlled by a top block select signal $TBSEL_A$.

The local virtual ground line 78 is coupled to a virtual ground terminal metal line 59 across conductor 54A through bottom block selector transistor 85. The drain of the bottom block select transistor 85 is coupled to the local virtual ground line 78. The source of the bottom block select transistor 85 is coupled to the conductor 54A. The gate of the bottom block select transistor 85 is controlled by a bottom block select signal $BBSEL_A$. In the preferred system, the conductor 54A is a buried diffusion conductor which extends to a metal-to-diffusion contact 60A at a position displaced horizontally through the array, which provides contact to a vertical metal virtual ground bus 59.

The global bit lines (83, 84) extend vertically through the array to respective column select transistors 70, 71, through which a selected global bit line is coupled to sense amps and program data circuitry (not shown). Thus the source of column select transistor 70 is coupled to global bit line 83, the gate of column select transistor 70 is coupled to a column decode signal $Y_{n(M-1)}$, and the drain of the column select transistor 70 is coupled to conductor 90.

FIG. 2 illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bit line pair (e.g., bit lines 91, 92). As one proceeds up the bit line pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 59 through metal-to-diffusion contacts 60A, 60B. The subarrays repeat on opposite sides of the metal virtual ground line 59 so that adjacent subarrays share a metal virtual ground line 59. The metal virtual ground line 59 is coupled to array ground and erase high-voltage circuitry. Thus, the subarray layout requires two metal contact pitches per column of two transistor cells for the global bit lines and one metal contact pitch per subarray for the metal virtual ground line 59.

Furthermore, two or more subarrays as illustrated in FIG. 2 may share word line signals as illustrated because of the additional decoding provided by the top and bottom block select signals TBSELA, TBSELB, BBSELA, and BBSELB. In one preferred system, each block is configured to include four subarrays in a column, a row in each subarray, sharing a common word line drivers with rows in the other three subarrays. Decoding amongst the four subarrays is executed using the top block select transistors in response to TBSLEA and TBSELB. Each subarray includes 32 word lines and 1K (1,024) bit lines. Thus, with four subarrays, 32 word lines deep, and 1K bit lines wide, a block of 128K cells is provided. Thirty-two blocks makes a 4 megabyte memory.

As can be seen, the architecture of FIG. 2 provides a sectored flash memory array. This is beneficial because the source and drain of transistors in non-selected subarrays during a read, program or erase cycle may be isolated from the currents and voltages on the bit lines and virtual ground lines. Thus, during a read operation, sensing is improved because leakage current from subarrays not selected does not contribute to current on the bit lines. During the erase operation, the high voltages of the virtual ground line are isolated from the unselected blocks by the BBSEL transistors. BBSEL is driven with high voltage to pass array high voltage when the block erase flag is set, and with zero volts when the block erase flag is reset. This allows a block erase operation.

Figure 3:
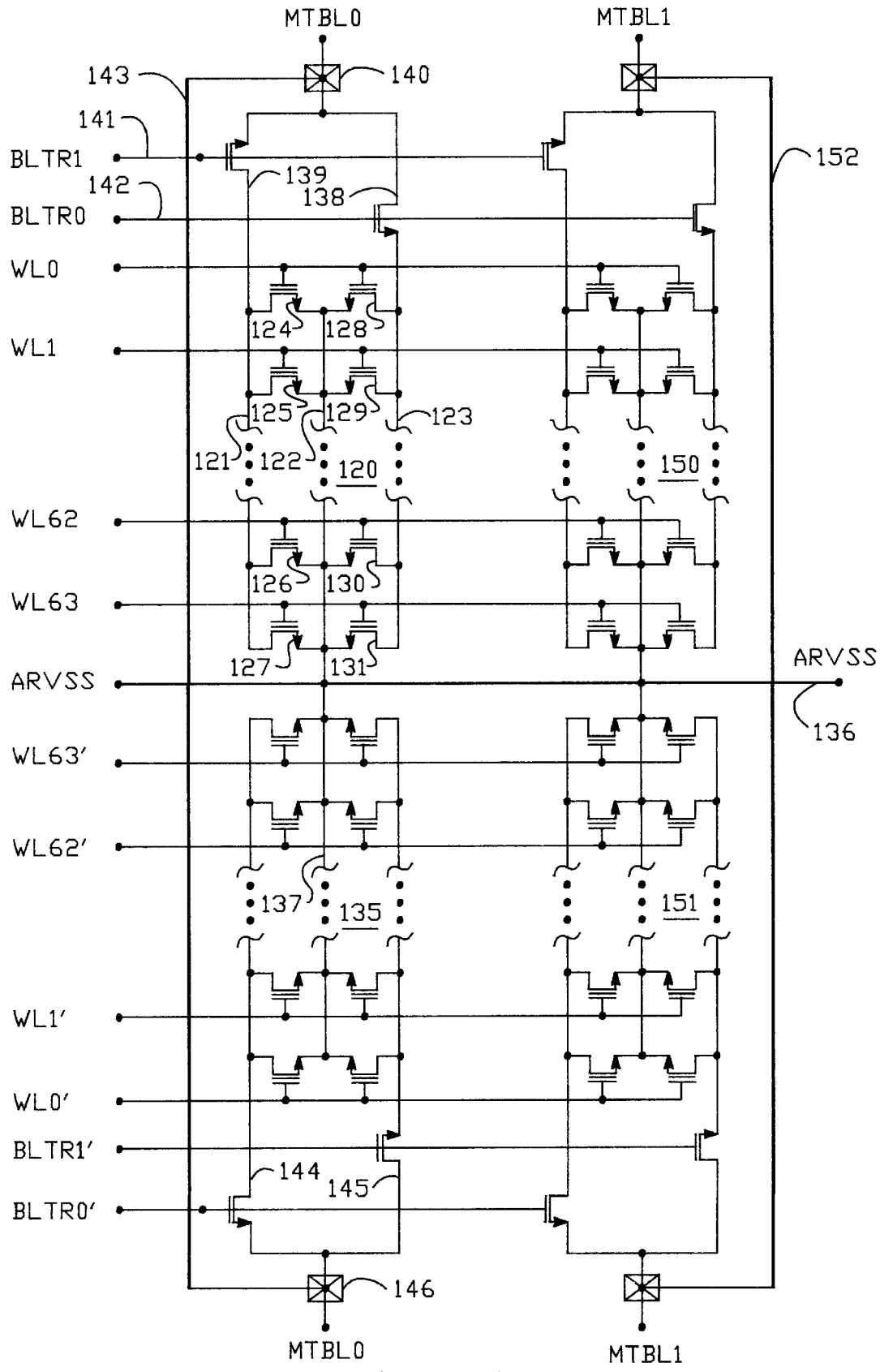
FIG. 3 is a circuit diagram illustrating another preferred integrated circuit memory architecture for use in the system of FIG. 1.

FIG. 3 illustrates an alternative architecture of the flash memory array according to the present invention, in which two columns of flash memory cells share a single metal bit line. FIG. 3 shows four segments of the array, where each segment includes a pair of columns of flash memory cells in a drain-source-drain configuration.

Thus, the first segment 120 includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first one of the pairs of columns includes cell 124, cell 125, cell 126, and cell 127. Not shown are cells coupled to word lines WL2 through WL61. The second one of the pair of columns includes cell 128, cell 129, cell 130, and cell 131. Along the same column of the array, a second segment 135 is shown. It has a similar architecture to the segment 120 except that it is laid out in a mirror image.

Thus, as can be seen, the transistor in the first one of the pair of columns, such as the cell 125, includes a drain in the drain diffusion line 121, and a source in the source diffusion line 122. A floating gate overlays the channel region between the first drain diffusion line 121 and the source diffusion line 122. The word line WL1 overlays the floating gate of the cell 125 to establish a flash cell.

The segment 120 and segment 135 share an array virtual ground diffusion 136. Thus, the source diffusion line 122 of segment 120 is coupled to the diffusion line 136. Similarly, the source diffusion line 137 of segment 135 is coupled to the source diffusion line 136.

As mentioned above, each pair of columns of cells in a given segment (e.g., segment 120) shares a single metal line. Thus, a block right select transistor 138 and a block left select transistor 139 are included. The transistor 139 includes a source in the drain diffusion line 121, a drain coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 through metal contact 140. As can be seen, segment 135 includes left select transistor 144 and right select transistor 145 which are similarly connected to a metal contact 146. Contact 146 is coupled to the same metal line 143 as is contact 140 which is coupled to segment 120.

Segments are laid out horizontally and vertically to provide an array of flash cells comprising M word lines and 2N columns. The array requires only N metal bit lines each of which is coupled to a pair of columns of flash cells through select circuitry, as described above.

Although the figure only shows four segments 120, 135, 150, and 151, coupled to two metal bit lines 143 and 152, the array are repeated horizontally and vertically as required to establish a large scale flash memory array. The layout of the array is compact because of the virtual ground configuration, the reduced metal pitch requirement for the layout, and further by the ability to share word line drivers amongst a plurality of rows in different segments. Thus, word line WL63' may share a word line driver with word line WL63. In an example system, eight word lines share a single word line driver. Thus, only the pitch of one word line driver circuitry is needed for each set of eight rows of cells. The additional decoding provided by the left and right select transistors (139, 138 for segment 120) allows the shared word line configuration. The shared word line configuration has the disadvantage that during a block erase operation, eight rows of cells all receive the same word line voltage, causing a word line disturbance in cells that are not desired to be erased. If it is a problem for a given array, this disturbance problem can be eliminated by insuring that all block erase operations decode for segments including all rows of cells coupled to the shared word line drivers. For eight word lines sharing a single driver, this requires a minimum block erase of eight rows.

Figure 4:
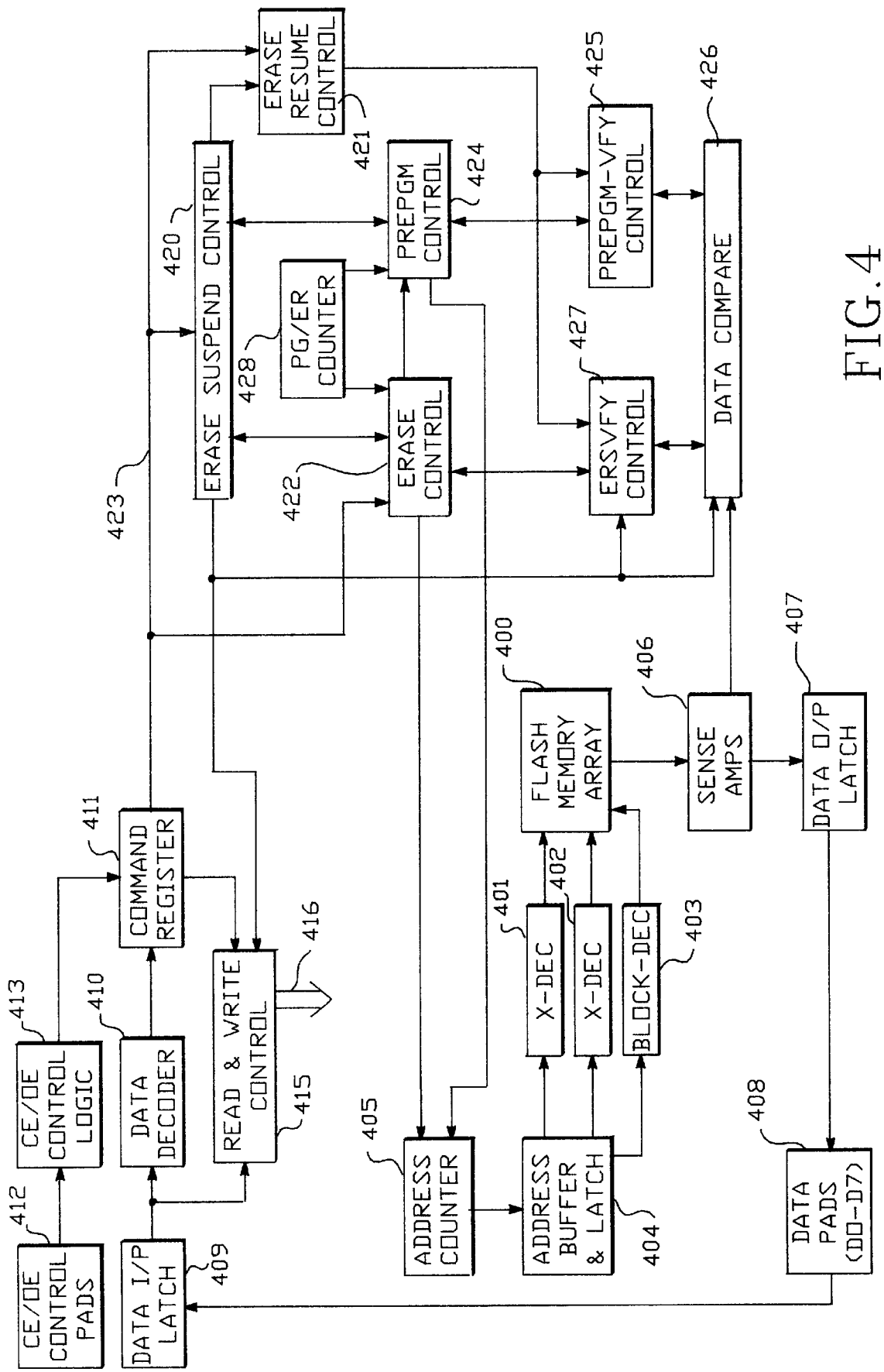
FIG. 4 is a simplified block diagram of an integrated circuit flash memory device including the erase suspend logic of the present invention.

FIG. 4 is a simplified diagram of a flash memory integrated circuit including the erase suspend logic of the present invention. The integrated circuit includes a flash memory array 400, having an architecture such as illustrated in FIGS. 2 or 3 above. Coupled to the flash memory array 400 are a X decoder 401 and a Y decoder 402 for driving the word line and bit line selectors in the flash memory array 400. Also, in the preferred system a block decoder 403 is coupled to the flash memory array 400 for selecting blocks for the purposes of erase procedure.

The X decoder 401, Y decoder 402 and block decoder 403 are coupled to an address buffer and latch circuit 404. The address buffer and latch circuit 404 is preferably coupled to address pads on the chip (not shown), as well as an address counter 405.

Also coupled to the flash memory array 400 is a set of sense amplifiers 406. The sense amplifiers are coupled to a data output latch 407, and to data pads 408.

The data pads 408 in one preferred system are coupled to a data input latch 409 which in turn is connected to a data decoder 410. The data decoder 410 is coupled to a command register 411 and interprets the input data sequences to detect and supply commands to the command register 411. Chip enable and output enable control pads 412 are coupled to chip enable and output enable control logic 413. The chip enable and output enable control logic 413 is also coupled to the command register 411 used in decoding commands.

The data input latch 409 is also coupled to read and write control logic 415. The read and write control logic is responsive to read and write commands in the command register 411 for the purposes of managing reading and writing into the flash memory array 400. The read and write control circuit is coupled to a number of elements in the integrated circuit as represented by arrow 416.

As shown in FIG. 4, the integrated circuit of the present invention includes an erase suspend control logic 420. The erase suspend control logic is coupled to erase resume control logic 421. Also, erase control logic 422 is included on the chip. The erase control logic 422, erase resume logic 421, and erase suspend logic 420 are coupled to the command register 411 on line 423. The erase control logic 422 in the preferred system includes a plurality of block erase flags as mentioned above with respect to FIG. 1. However, the block erase flags are not shown in FIG. 4 for simplicity.

The erase control logic 422 is responsive to an erase command on line 423 to begin a block erase procedure. The block erase procedure includes a precondition phase which is executed by the pre-program control logic block 424 which is coupled to the erase control logic 422. The pre-program control logic block 424 is coupled to a program verify control logic block 425. As part of the program verify process of the precondition phase, a data compare step is executed in data compare logic 426. The data compare logic 426 is coupled to the sense amps 406 for the purposes of verifying successful pre-programming of data in the flash memory array 400 on a byte-by-byte basis. Once the array has been successfully pre-programmed, the erase control applies an erase pulse to selected blocks in the flash memory array. After application of the erase pulse under control of the erase control block 422, an erase verify control logic block 427 is enabled. Erase verify control logic block 427 is coupled to the data compare logic 426 for the purposes of verifying a successful erasing of blocks in the flash memory array on a byte-by-byte basis.

A program and erase retry counter 428 is coupled to the erase control and the pre-program control blocks 422 and 424. The program and erase retry counter 428 keeps track of the number of attempts of erasing a block, and the number of attempts of pre-programming a byte in the block. If more than a threshold number of attempts is executed, then an error is indicated.

The erase suspend control logic 422 is coupled to the read and write control logic 415, the erase verify control, the erase control, and the pre-program control blocks in order to manage suspension of the erase procedure as efficiently and quickly as possible after issuance of the erase suspend command.

The erase resume control logic 421 is responsive to commands on line 423 to cause resuming of the erase procedure at an appropriate point, depending on the place in which the erase suspend process was executed.

Figure 5:
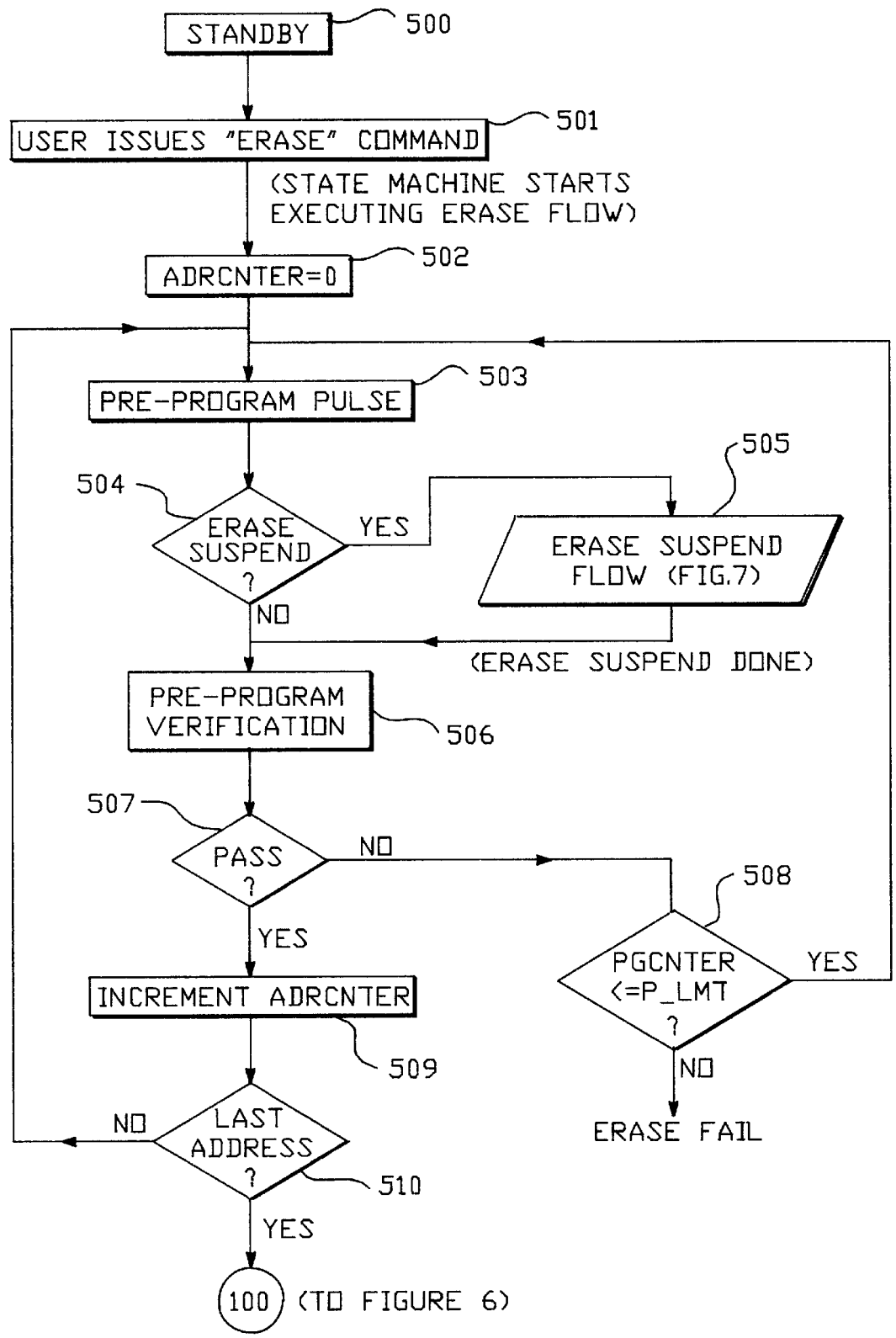
FIG. 5 is a flow chart of a precondition phase of a block erase procedure including erase suspend checkpoints of the present invention.
Figure 6:
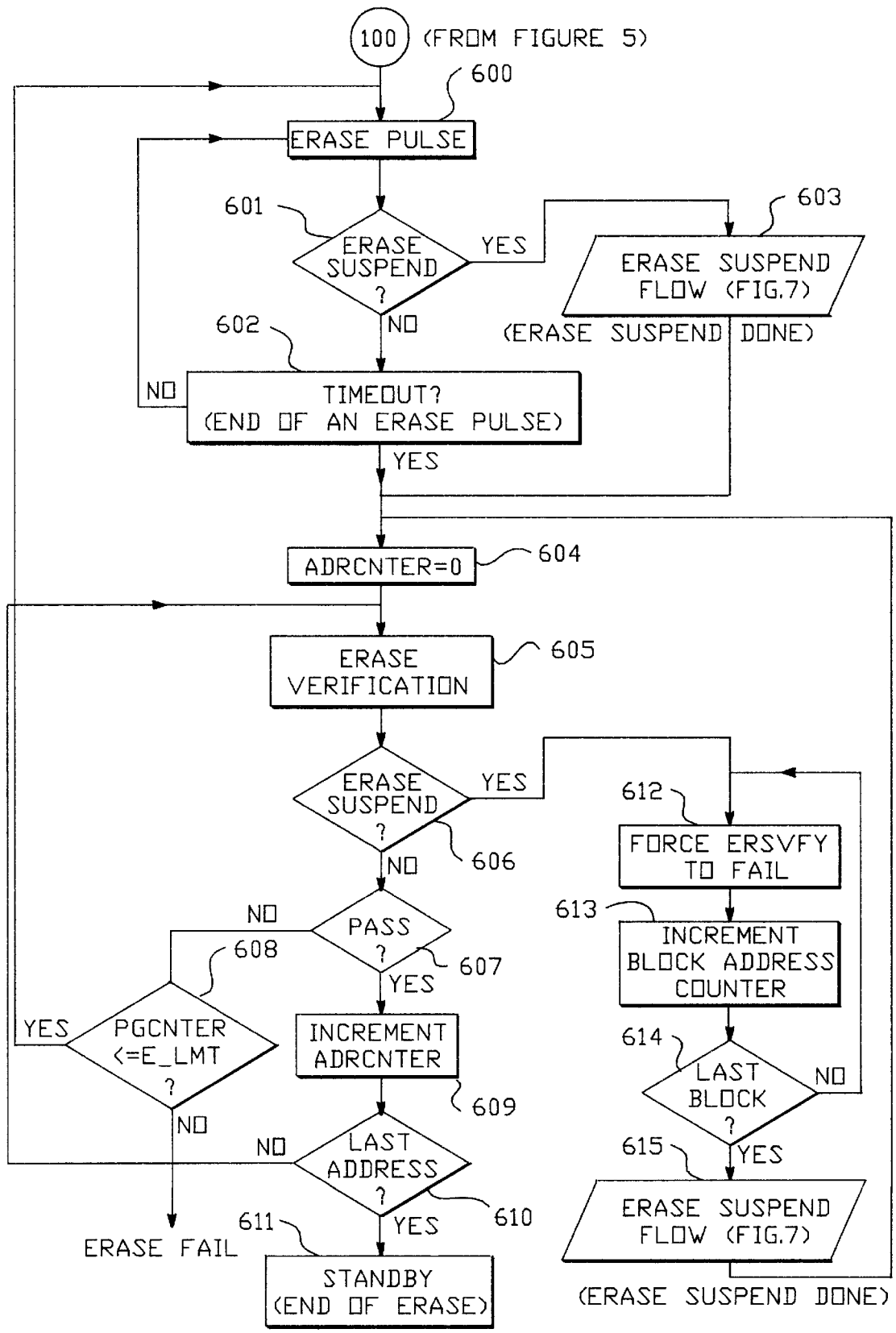
FIG. 6 is a flow chart of an erase phase of a block erase procedure including erase suspend checkpoints of the present invention.
Figure 7:
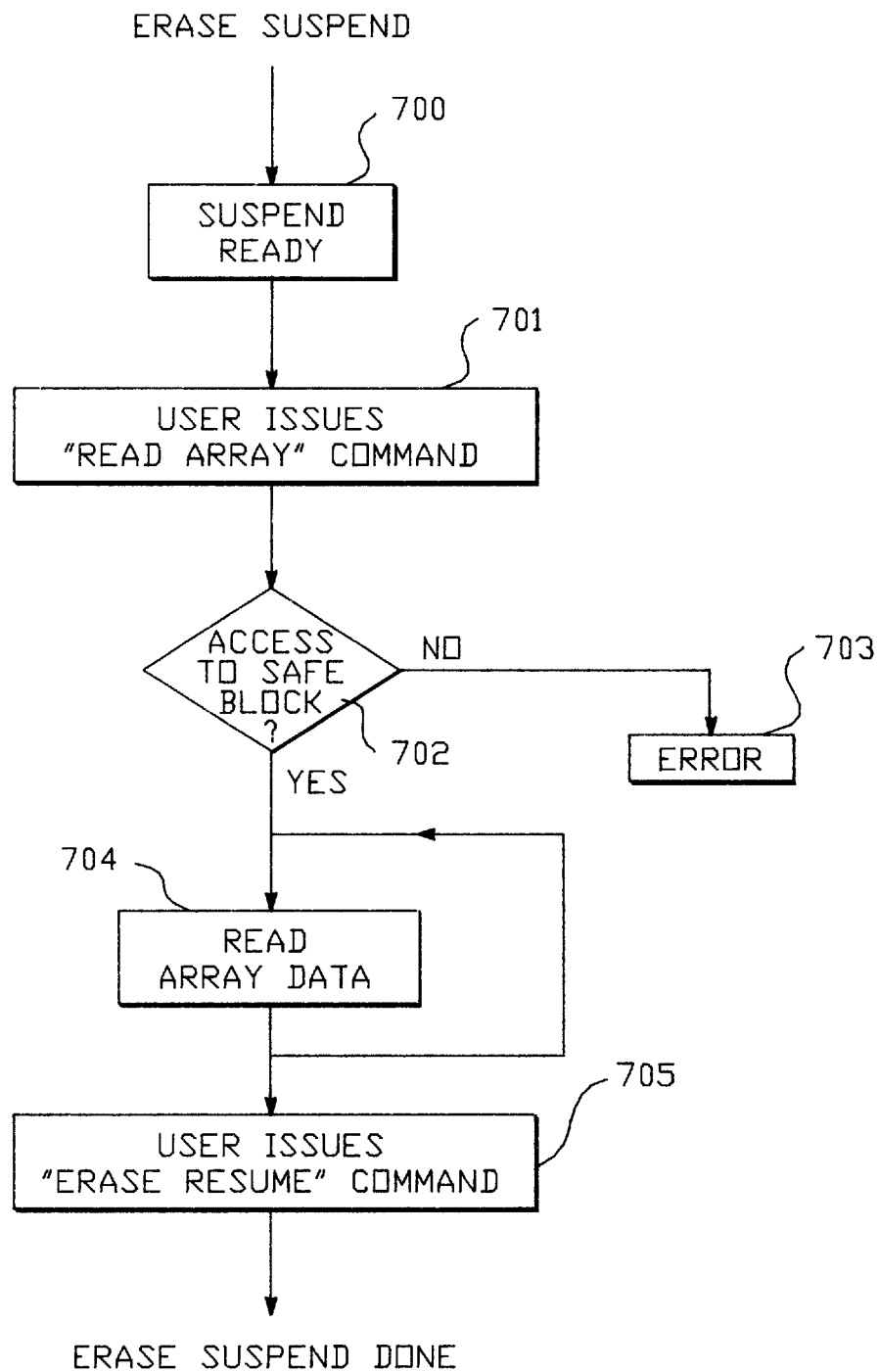
FIG. 7 is a flow chart of an erase suspend process executed in the procedures of FIGS. 5 and 6.

More details concerning the procedures involved in the block erase logic according to the present invention can be understood with reference to FIGS. 5–8 below. FIGS. 5–7 illustrate the precondition, erase and suspend procedures involved in a block erase procedure according to the present invention. In FIG. 5, as can be seen, the logic waits in a standby mode (step 500). When the user issues an erase command, it is detected by the logic at step 501. At this point, the state machine starts executing an erase flow. At the beginning of the erase flow, the address counter is set to 0 (step 502). Next, a pre-program pulse is applied to the byte at address 0 (step 503). An erase suspend checkpoint occurs after application of the pre-program pulse at step 503. Thus, the algorithm checks to see if an erase suspend command has been received by the control logic (step 504). If the command has been received, then an erase suspend flow is executed (step 505). When the erase suspend process is done, or if no erase suspend command had been received at step 504, then a pre-program verification process is executed (step 506) for the byte which received the pulse. Next, the algorithm determines whether the byte passed the pre-program verify step (step 507). If it did not pass, then it is determined whether the program counter stores a number less than or equal to the program retry limit. If the program counter is less than the program retry limit, then the algorithm loops back to step 504 to retry pre-programming of the byte. If the program counter threshold is exceeded, then an erase fail condition occurs.

If at step 507, the byte did pass the pre-program, then the address counter is incremented (step 509). Next the algorithm determines whether this is the last address in the block subject of the erase procedure. If it is not the last address, then the algorithm loops back to step 503 to pre-program the next byte. If it is the last address, then the algorithm proceeds to point 100 to begin the process of FIG. 6, which corresponds to the erase phase of the block erase procedure. According to one embodiment of the present invention, the point 100 also corresponds to an erase suspend checkpoint.

In more technical terms, there are four periods in the pre-program phase, namely program, program recovery, program verify and program verify recovery. Both the program and program verify periods have some high voltage operations. Therefore, it is necessary to leave some recovery intervals after the program and program verify operation so that the circuits can recover from high voltage modes to discharge internal nodes, etc. In the preferred system, the suspension of the state machine occurs after the recovery intervals so that the circuits have recovered from high voltage operations. This way the chip is guaranteed to function correctly after the erase resume process.

Point 100 from FIG. 5 is shown on FIG. 6, the beginning of the erase phase of the block erase procedure. The first step in the erase phase is to begin applying the erase pulse to the block to be erased (step 600). An erase suspend checkpoint occurs during application of the erase pulse, as indicated by step 601. If no erase suspend command is received after the beginning of the erase pulse, and before a time out at the end of an erase pulse as indicated at step 602, then the algorithm continues to loop until the end of the erase pulse. If an erase suspend command is received at step 601, then an erase suspend flow is executed (step 603). After the erase suspend flow of step 603, or after the end of the erase pulse at step 602, the algorithm enters the erase verify stage by resetting the address counter to 0 (step 604). An erase verification process is executed on a byte-by-byte basis (step 605). The erase suspend checkpoint of step 601 preferably extends in addition from after ending of the erase pulse until before testing of the first byte in the erase verify process at step 607. The time in which the address counter is reset to 0 at step 604 can be anywhere in the process prior to the erase verify. Also, this resetting of the counter may be done in parallel with the monitoring for the erase suspend command.

An erase suspend checkpoint occurs during the erase verify stage on a byte-by-byte basis, as indicated by step 606. If no erase suspend command is received at step 606, then the algorithm determines whether the current byte has passed the erase verify process (step 607). If not, then the erase retry counter is tested at step 608. If the erase retry counter stores a value which is less than or equal to the erase retry limit, then the algorithm loops back to step 600 to reapply the erase pulse (if only one block involved, else the algorithm proceeds to a next block). If the erase retry limit is exceeded then an erase fail condition is encountered.

If at step 607, the current byte passes the erase verify test, then the address counter is incremented (step 609). Next the algorithm determines whether the last address in the block has been passed (step 610). If not, then the algorithm loops back to step 605 to continue erase verification on a byte-by-byte basis. If the last address has been passed, then the logic returns to the standby state at the end of the erase procedure (step 611).

If the erase suspend checkpoint at step 606 detects an erase suspend command, then the algorithm loops to step 612 to force the erase verify for the current block to fail. Next, the block address counter is incremented at step 613. The algorithm then tests whether this is the last block at step 614. If not, then the algorithm loops back to step 612 to force erase verify fail for all the blocks. After the last block, then the erase suspend flow is executed (step 615). After the erase suspend flow of step 615, the algorithm returns to point 604 to retry the erase verification process.

The erase suspend flow is illustrated in FIG. 7. Upon entry of the erase suspend flow, logic initializes, and issues a suspend ready signal (step 700). After suspend ready, the user issues a read array command, or a command for another type of access to a block other than the block or blocks subject of the erase procedure (step 701). At step 702, the procedure determines whether the access of step 701 is to a safe block (step 702). If not, then an error is indicated (step 703). If the access is to a safe block, then the read access or other access is executed (step 704). The erase suspend process is done when the user issues an erase resume command as indicated at step 705.

Figure 8:
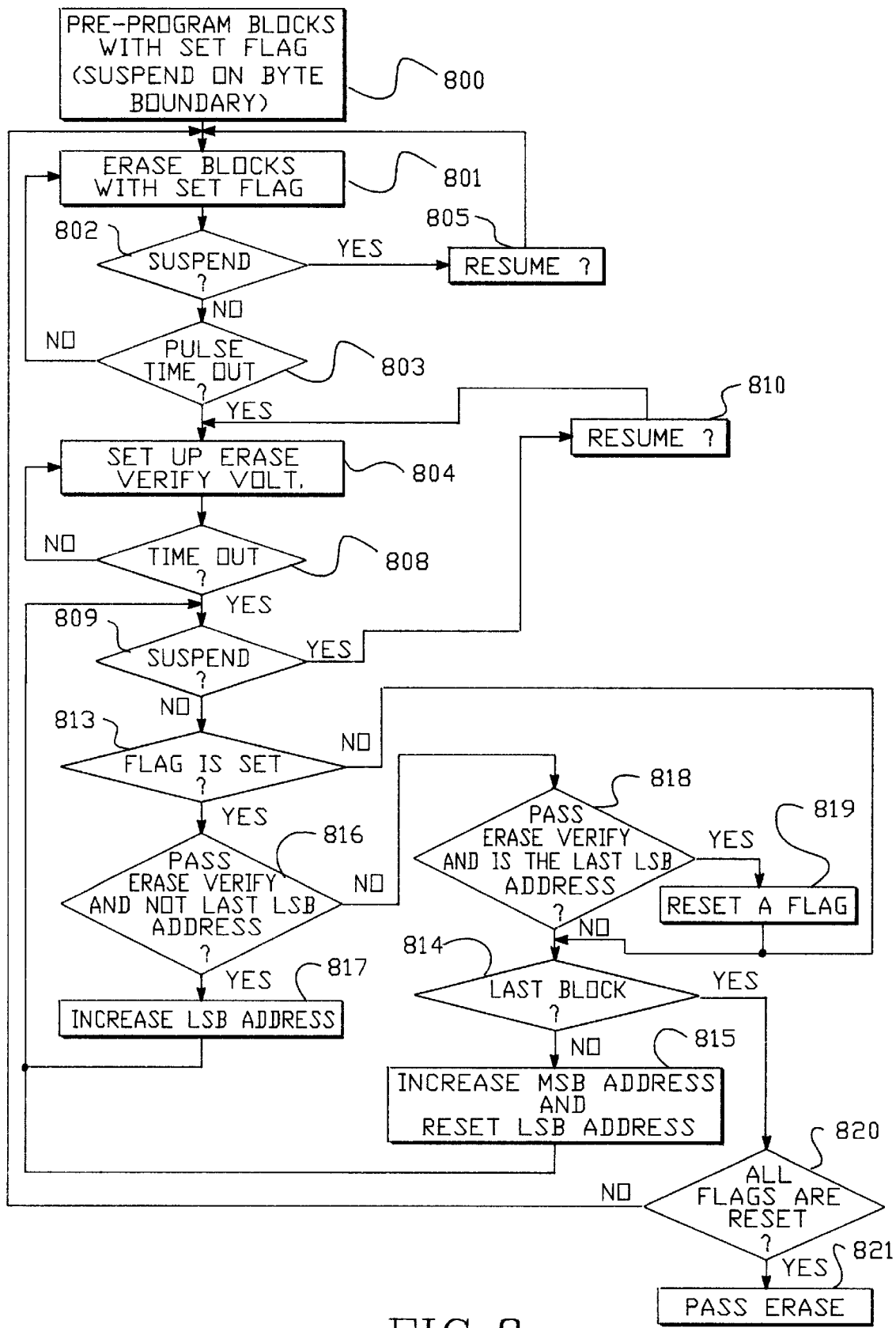
FIG. 8 is a flow chart illustrating the block erase procedure including the block erase flags according to another embodiment of the present invention.

FIG. 8 illustrates the algorithm for embedded erase which is executed by the control logic 12 using the flags 13 and address counter 14 of FIG. 1, to illustrate operation of the block erase flags. More details of block erase operation are set out in U.S. Pat. No. 5,414,664, cited above.

According to this preferred version of the embedded erase algorithm, an erase operation begins with the setting of one or more flags. For a chip erase, all flags are set and the address counters are initialized to address 0. If a block erase operation is to be executed, only flags for selected blocks are set. To start the erase procedure, a pre-program phase such as described above with reference to FIG. 5 having byte-boundary erase suspend capability is executed on selected blocks (step 800).

In the next step, all the blocks having a set flag are erased by application of an erase pulse (step 801). Then the entire set of selected blocks is erased by applying energizing voltages as described above segmented under control of the bottom block select transistor. During application of the erase pulse, the logic monitors the command interface for an erase suspend command (step 802). If no command occurs before the pulse times out (step 803), then the algorithm proceeds to erase verify process by setting up the erase verify voltages (step 804).

If at step 802, the erase suspend command is detected, then the algorithm executes an erase suspend process which is represented in FIG. 8 by the step 805 which looks for an erase resume command, and upon receipt of the command returns to step 801.

The erase verify process beginning at step 804 times out on setting up the erase verify voltages (step 808). After setting up the erase verify voltages, the logic monitors the command interface for the erase suspend command (step 809). If the command is received, then the algorithm executes an erase suspend process which is represented by step 810 in FIG. 8. In step 810, the erase resume command is watched for at the command interface. If the command is received, then the algorithm returns to step 804.

If no erase suspend command is received at block 809, then the flag for a current block is tested (step 813). If the flag is not set, then the algorithm branches to step 814 to test whether it is the last block in the chip. If it is not the last block, then the most significant bit address is increased and the least significant bit address is reset in order to proceed to the next block (step 815). After step 815, the algorithm loops back to step 809 to test the suspend command.

If the flag is set at block 813, then the algorithm determines whether the current byte has passed erase verify (step 816) and if the current byte is the last byte in the block. If it passes and it is not the last byte, then the less significant bit address is incremented to go onto the next byte (step 817), and the algorithm loops back to step 809 to test for the suspend command once again.

If at step 816, it is the last byte in the block, or it did not pass verify, then the algorithm loops to step 818 where it determines again whether the byte passed erase verify, and whether it is the last byte in the block. If it passed and it was the last byte, then the block erase flag is reset (step 819), and the algorithm proceeds to step 814 to determine whether the last block has been tested. If the byte did not pass verify at block 818, then the algorithm proceeds to step 814 to determine whether the last block has been tested and continues looping through steps 815 and 809 until all blocks are tested.

If at step 814, the last block is detected, then the algorithm tests at step 820 whether all flags have been reset. If they have all been reset, then the erase procedure has been verified (step 821). If not all of the flags are reset at this point, then the algorithm loops back to step 801 to erase the blocks which still have a set flag.

FIGS. 9, 10 and 11A–11B are simplified logic diagrams and a timing diagram illustrating the erase suspend operation corresponding to block 504 of FIG. 5. FIGS. 12, 13, 14, 15 and 16A–16B provide a simplified logic and timing for the erase suspend operation corresponding to block 601 of FIG. 6. FIGS. 17 and 18 provide simplified logic corresponding to the erase suspend process at block 606 of FIG. 6. The logic and timing provided in theses FIGS. 9–18 provide an example of the timing of the erase suspend process, and simple logic used with the state machine to control the timing. Other techniques and timings can be utilized depending on the particular implementation of the erase suspend algorithm of the present invention.

Figure 9:
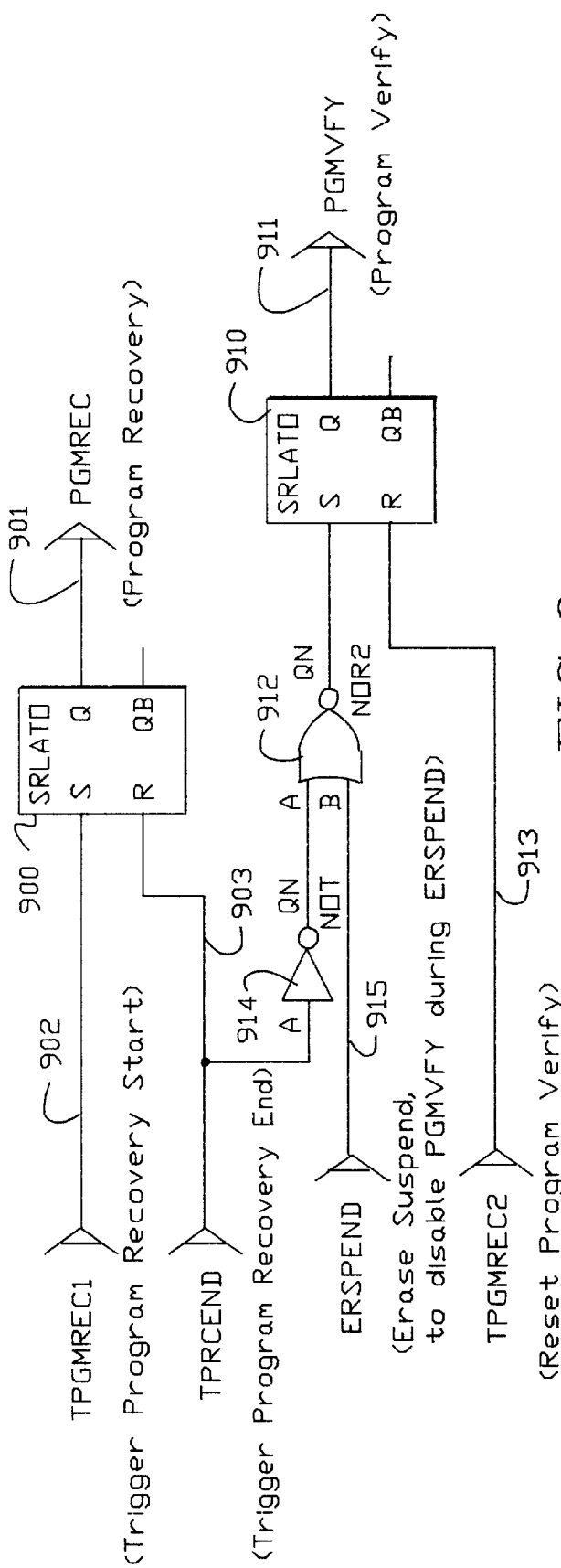

FIG. 9 is a logic diagram showing the operation of the erase suspend signal on generation of the program recovery PGMREC and program verify PGMVFY control signals. The logic includes a set/reset latch 900 (SR latch) which generates an output PGMREC on line 901. The output PGMREC on line 901 establishes a timing window for recovering the high voltages used during the program pulse. The inputs to the SR latch 900 include the TPGMREC1 signal on line 902, and the TPRCEND signal on line 903. The TPGMREC1 signal is a control signal generated by the state machine to trigger program recovery. The TPRCEND signal on line 903 is a trigger signal generated by the state machine to cause the program recovery interval to end.

The logic in FIG. 9 also includes SR latch 910 which generates the PGMVFY signal on line 911, signifying a program verify interval. The set input to the SR latch 910 is the output of NOR gate 912. The reset input is the TPGM-REC2 signal on line 913. The inputs to the NOR gate 912 include the output of inverter 914, the input of which is the TPRCEND signal on line 903, and the ERSPEND signal on line 915. The ERSPEND signal on line 915 is the erase suspend signal generated by the state machine to disable the program verify sequence during an erase suspend interval. The TPGMREC2 signal on line 913 is a control signal used to reset the program verify SR latch 910 to end the program verify interval.

Figure 10:
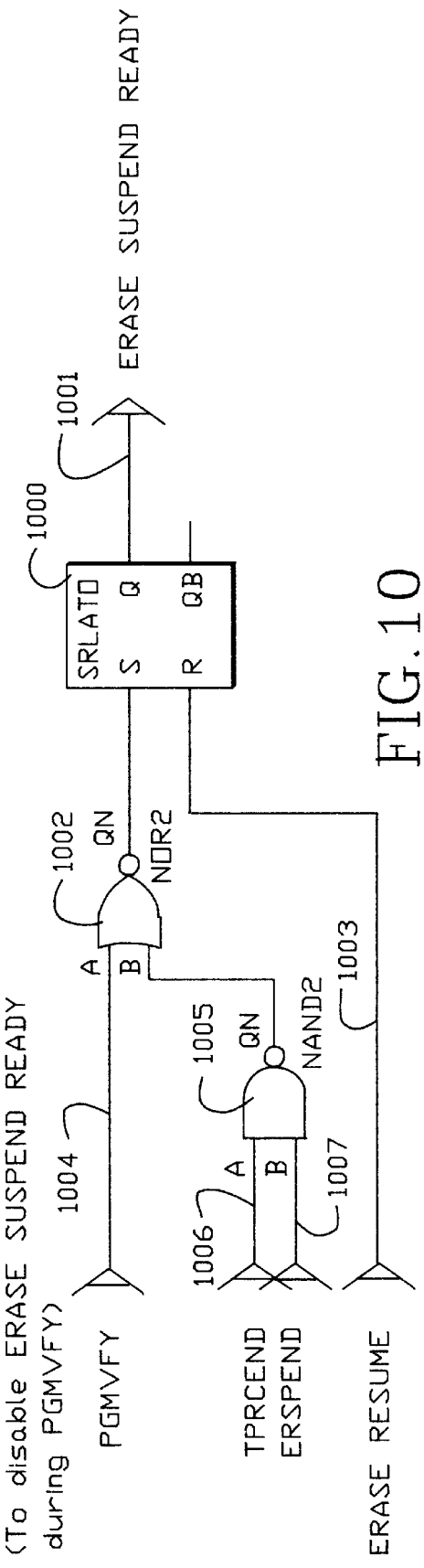

FIG. 10 illustrates logic used to generate the ERASE SUSPEND READY signal which corresponds to a signal to the user of the memory device that erase suspend has been successfully accomplished, and a read operation may be executed. This logic includes SR latch 1000 and generates the ERASE SUSPEND READY signal on line 1001. The inputs to the SR latch 1000 include the output of NOR gate 1002 at the set input, and the ERASE RESUME signal on line 1003 at the reset input. Inputs to the NOR gate 1002 include the PGMVFY signal on line 1004, and the output of NAND gate 1005. The inputs to NAND gate 1005 include the TPRCEND signal on line 1006, and the ERSPEND signal on line 1007.

The operation of the logic of FIGS. 9 and 10 can be understood with respect to the timing diagrams in FIGS. 11A and 11B. With reference to FIG. 11A, the program timing sequence can be understood. First, a program interval begins at point 1100. The program pulse cycle lasts until the end of the program signal at point 1101. At point 1101, the program recovery interval begins in response to the TPGMREC1 pulse at point 1102. During the program recovery interval, the high voltages generated during the program pulse cycle settle out. The end of the program recovery interval is signaled by the TPRCEND pulse at point 1103. After the program recovery sequence, program verify is initiated. Again, this interval is initiated by the TPRCEND pulse point 1103. The end of the verify interval is signaled by the TPGMREC2 pulse at point 1104. After a program verify recovery interval represented by pulse 1105, another program sequence begins.

In FIG. 11B, the erase suspend at the checkpoint at block 504 of FIG. 5 is illustrated. The first four traces in FIG. 11B correspond to the same four traces in FIG. 11A and are given like references numbers. However, an erase suspend signal is issued at point 1110 in the timing diagram of FIG. 11B. With the erase suspend signal high, the ERASE SUSPEND READY signal on line 1101 is generated in response to the TPRCEND signal at point 1103. The program verify and program verify recovery sequences do not occur. Thus it can be seen in FIG. 11B, that the erase suspend command results in interruption of the pre-programming process between application of the programming pulse after recovery at point 1103, and the beginning of the program verify operation, if the suspend command is issued during the program pulse between points 1100 and 1101. Also, the same effect occurs if the suspend command is received during the program recovery interval between points 1101 and 1103. If the erase suspend command happens after the TPRCEND signal on line 1106, then the ERASE SUSPEND READY will not be issued until the next program cycle, in this example implementation.

In normal conditions, after the program pulse in the pre-programming interval, an electrical pulse TPGMREC1 is sent out by a timer to set the state machine to a program recovery period, in which the associated circuits and programmed cells will recover from high voltage stress state to a normal voltage state. After the program recovery period, the timer sends an electrical pulse TPRCEND to reset the program recovery signal to a low state and set the PGMVFY signal to a high state to start program verify. If the user issues an erase suspend command during the auto erase process at the pre-programming step, this suspend command will prevent the transition from program recovery state to program verify state. If the erase suspend command is issued after the PGMVFY signal is high, the program verify sequence will not be stopped until the next program recovery interval is completed.

During the pre-programming step, the ERASE SUSPEND READY signal is valid only if both erase suspend command has been issued, and a program recovery interval has expired allowing the circuitry to reach the normal voltage state. The erase resume command resets the ERASE SUSPEND READY signal to the low state. Once erase resume is issued, the state machine brings the TPRCEND signal to a high state and triggers the PGMVFY signal to resume the flow from program verify.

Figure 12:
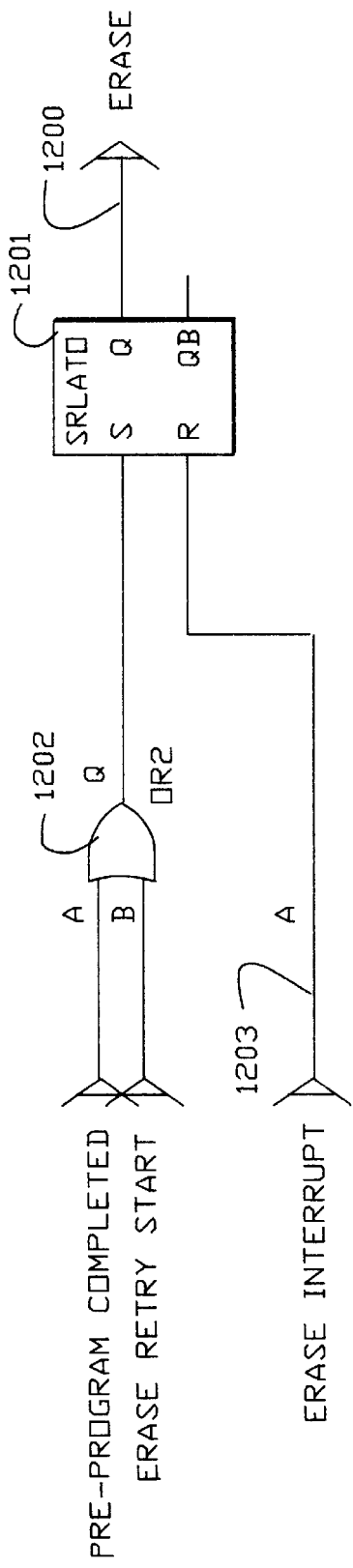
Figure 13:
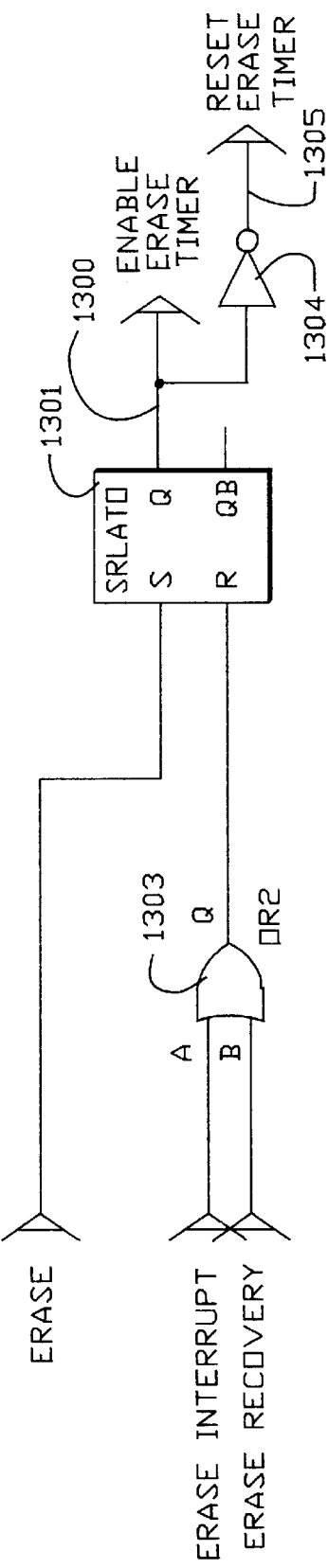

FIGS. 12, 13, 14, 15 and 16A–16B illustrate logic and timing for generating the ERASE SUSPEND READY signal during the checkpoint at block 601 of FIG. 6. In FIG. 12, the generation of the ERASE command on line 1200 can be understood. The ERASE command on line 1200 is generated the output of SR latch 1201. The set input of the SR latch 1201 is the output of OR gate 1202. The reset input to SR latch 1201 is the ERASE INTERRUPT signal on line 1203. The inputs to OR gate 1202 include the PRE-PROGRAM COMPLETED signal and the ERASE RETRY START signal. FIG. 13 illustrates the generation of the ENABLE ERASE TIMER and RESET ERASE TIMER signals on lines 1300 and 1305 respectively. These signals are generated using the SR latch 1301. The set input to the SR latch 1301 is the ERASE signal generated as shown in FIG. 12. The reset input to the SR latch 1301 is the output of OR gate 1303. The inputs to the OR gate 1303 include the ERASE INTERRUPT and ERASE RECOVERY signals.

The erase interval ends under control of the ERASE INTERRUPT signal which is generated as shown in FIG. 14. AND gate 1400 generates the ERASE INTERRUPT signal on line 1402 and the ERASE RECOVERY START signal for the erase suspend process on line 1402. The inputs to the AND gate 1400 include the ERASE signal generated as shown in FIG. 12, and the user generated ERASE SUSPEND signal.

FIG. 15 illustrates generation of the ERASE SUSPEND READY signal on line 1500. Signal on line 1500 is generated at the output of the SR latch 1501. The set input of SR latch 1501 is the output of AND gate 1502. The inputs to AND gate 1502 include the ERASE RECOVERY DONE signal and the ERASE SUSPEND signal. The reset input to the SR latch 1401 receives the ERASE RESUME signal.

Figure 16A:
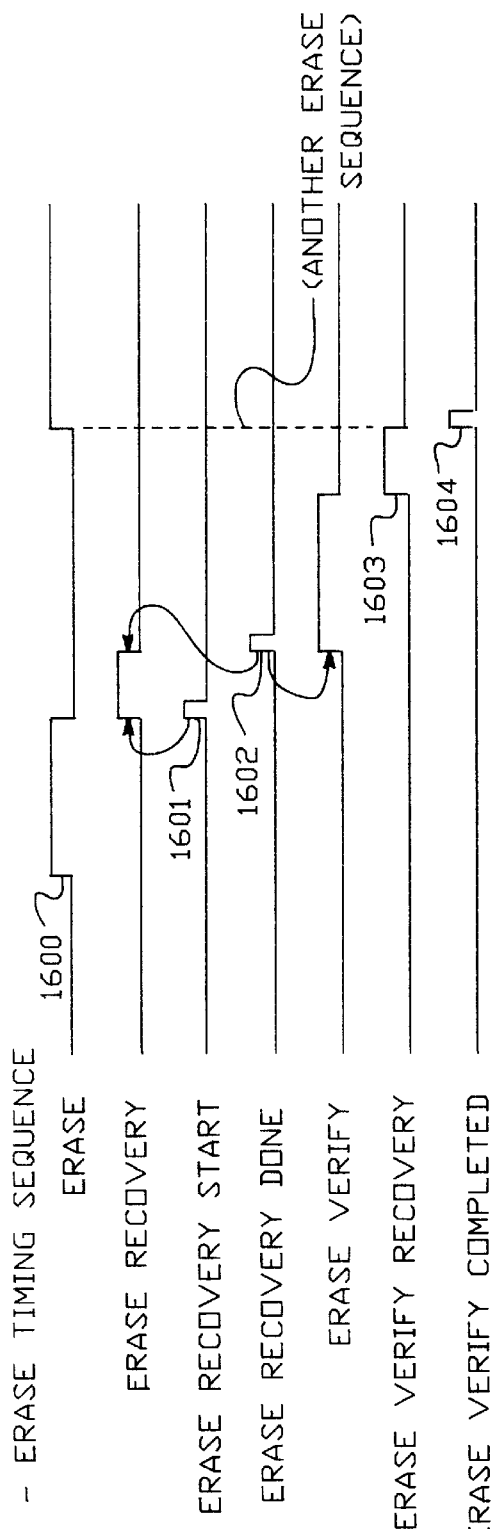
Figure 16B:
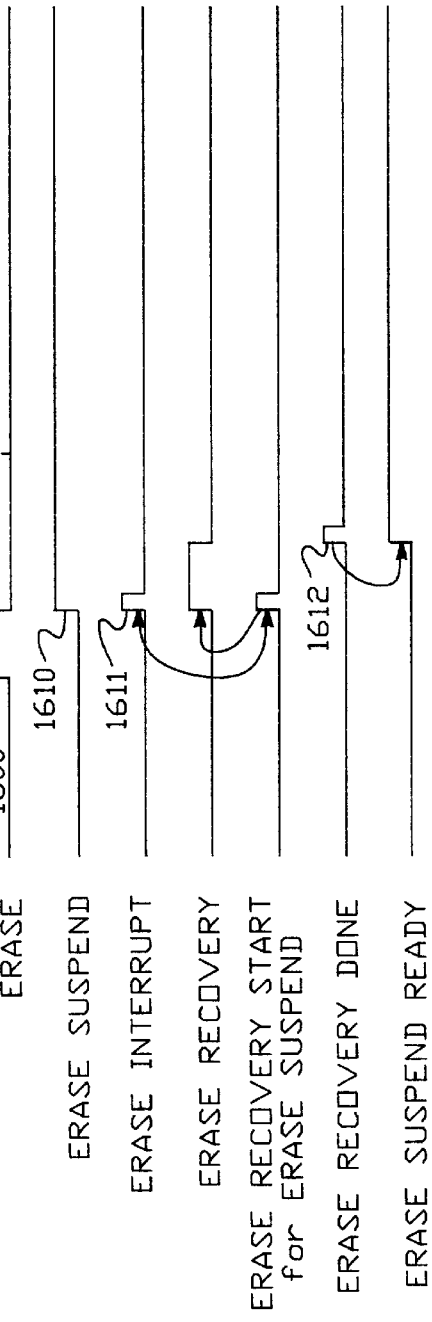

FIGS. 16A and 16B illustrate the timing for the erase suspend process at checkpoint 601 of FIG. 6. As can be seen in FIG. 16A, the erase interval begins at point 1600. At the end of the erase interval 1600, an erase recovery start signal is generated at point 1601. This initiates the erase recovery interval. An erase recovery done signal at point 1602 is issued in response to the timer. This results in the beginning of the erase verify interval and the ending of the erase recovery interval. After the end of an erase verify sequence, an erase verify recovery interval begins at point 1603. An erase verify completed pulse is generated by the state machine at point 1604, marking the beginning of another erase sequence.

If the erase suspend process occurs at point 601 of FIG. 6, the timing is altered as shown in FIG. 16B. In particular, if an erase suspend signal is issued at point 1610 during an erase pulse, then the erase interrupt signal is generated at point 1611. This causes the erase interval to be terminated, and an erase recovery start process to begin. The erase recovery start signal causes the initiation of an erase recovery interval as indicated in the figure. At the end of the erase recovery interval, an erase recovery done pulse is generated at point 1612. This causes the erase suspend ready signal to be activated, provided the erase suspend signal remains active. The signal stays high until the erase resume signal resets the latch 1501 of FIG. 15.

In this example, the erase signal sets an erase control timer to count ten milliseconds for an erase pulse cycle. After that pulse cycle, the erase recovery signal which is generated by the state machine resets the erase period and triggers the erase recovery period. The purpose of the erase recovery period is to relax high voltages used during the erase pulse cycle. Once the erase recovery period is completed, the erase sequence enters the erase verify sequence. If the user issues an erase suspend command during the erase pulse, the erase timer will be disabled immediately by the erase interrupt signal as can be seen in FIG. 13. The erase pulse width is also shortened by the erase interrupt signal. This condition also triggers an erase recovery. The erase suspend ready follows completion of the erase recovery interval at point 1612.

FIGS. 17 and 18 illustrate logic for the erase suspend process at the checkpoint block 606 of FIG. 6. As can be seen, in FIG. 17, an ERASE SUSPEND INITIATION signal is generated at the output of SR latch 1700. The set input to the SR latch 1700 is the output of AND gate 1701. The inputs to AND gate 1701 include the ERASE VERIFY signal and the ERASE SUSPEND signal. The reset input of the SR latch 1700 is the ERASE RESUME signal. The output of the SR latch 1700 is the ERASE SUSPEND INITIATION signal. SR latch 1702 is used to generate the ERASE SUSPEND READY signal. The reset input to SR latch 1702 is the ERASE RESUME signal. The set input to the SR latch 1702 is the output of AND gate 1703. The inputs to AND gate 1703 include the ERASE VERIFY COMPLETED signal and the ERASE SUSPEND signal.

In FIG. 18, the match signal used for the purpose of resetting block erase flags, for the process of FIG. 8, is generated. The match signal is generated at the output of NOR gate 1800. The inputs of NOR gate 1800 and the ERASE SUSPEND INITIATION signal, and the output of inverter 1802. The input of inverter 1802 is the DATA COMPARE MATCH signal generated by the verify comparator.

Normally during the erase verify step, the state machine checks the erased cell to determine whether it has been successfully erased by a DATA COMPARE MATCH operation. This procedure is executed until a cell fails verify or the last erased cell is verified. The comparison results of the erased cells decide whether another erase retry sequence, involving an erased pulse and an erase verify sequence will be needed for the current block.

During the erase verify step, if the user issues an erase suspend command, the ERASE SUSPEND INITIATION signal is set high to force the DATA COMPARE MATCH signal to a low state as can be seen in FIG. 18. This condition represents that the last of the erase cells, right after the erase suspend is issued, are forced to an unmatched state. This causes the state machine to skip to the next block having a set flag, and so on until the final block is reached. Then the ERASE VERIFY COMPLETED signal is set high, and the ERASE SUSPEND READY signal is activated.

The logic diagrams in FIGS. 9–18 are simplified diagrams tended to show the gross timing of the erase suspend and resume operation. In actual implementations, synchronous non-overlapping clocks are utilized to prevent race conditions. Obviously many variations on the logic can be utilized, depending on a particular system in which the invention is implemented.

Accordingly, the present invention provides for multiple checkpoints in the erase procedure for an erase suspend operation. To suspend the erase procedure as fast as possible, the algorithm of the present invention allows the erase procedure to be interrupted at the end of the first pre-program pulse, and after the suspend command is issued regardless of whether the byte subject to the pre-programming has been successfully programmed. This prevents multiple retries at pre-programming a given byte from causing a long wait before execution of the suspend algorithm. Furthermore, the present invention allows for the erase procedure to be interrupted during the erase pulse cycle. This provides a substantial improvement in efficiency and execution of the erase suspend command, particularly in systems involving a long erase pulse. Finally, the erase suspend checkpoint during erase verification of the present invention is adapted to operate efficiently with block erase procedures which allow for block erase of more than one block in a set of blocks.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit memory, comprising:
   a memory array, the memory array including a plurality of blocks of floating gate memory cells;
   block erase logic coupled to the memory array which executes a block erase procedure to erase selected blocks of memory cells in response to a block erase command, the block erase procedure including
   a precondition phase, in which a selected block is pre-programmed by applying a program potential, and then pre-programming of the block is verified, and
   an erase phase, in which the selected block is erased by applying an erase potential, and then erasing of the block is verified; and
   erase suspend logic coupled to the block erase logic which executes an erase suspend procedure to suspend the block erase procedure in response to an erase suspend command, the erase suspend procedure including
   interrupting the block erase procedure after receiving the erase suspend command during a checkpoint in a set of checkpoints in the block erase procedure, the set comprising a first checkpoint enabling the interrupting during the precondition phase, a second checkpoint enabling the interrupting during applying the erase potential, and a third checkpoint enabling the interrupting during verifying the erasing, and
   returning to the block erase procedure.

2. The integrated circuit memory of claim 1, wherein the first checkpoint enables the interrupting after applying said program potential and before verifying the pre-programming.

3. The integrated circuit memory of claim 2, wherein blocks in the plurality of blocks include a plurality of multibit segments of data, and said precondition phase includes logic to pre-program said selected block by multibit segment, by sequentially applying a program potential to a multibit segment, verifying the pre-programming of the multibit segment, and proceeding to a next multibit segment in the block until the block is pre-programmed, and wherein the first checkpoint is between the pre-programming of multibit segments.

4. The integrated circuit memory of claim 2, wherein blocks in the plurality of blocks include a plurality of multibit segments of data, and said precondition phase includes logic to pre-program a selected block by multibit segment, by sequentially applying a program potential to a multibit segment, verifying the programming of the multibit segment, and proceeding to a next multibit segment in the block until the block is pre-programmed, and wherein the first checkpoint enables the interrupting after application of a program potential to a multibit segment and before the verification of the programming of the multibit segment.

5. The integrated circuit memory of claim 1, wherein blocks in the plurality of blocks include a plurality of multibit segments of data, and said erase phase includes logic to apply an erase potential to the plurality of multibit segments, and wherein the second checkpoint enables the interrupting during applying of the erase potential.

6. The integrated circuit memory of claim 1, wherein blocks in the plurality of blocks include a plurality of multibit segments of data, and said erase stage includes logic to verify the erasing by sequentially testing a multibit segment and proceeding to a next multibit segment until the erasing of the block is verified, and wherein the third checkpoint enables the interrupting between testing of multibit segments.

7. The integrated circuit memory of claim 1, wherein blocks in the plurality of blocks include a plurality of multibit segments of data, and said erase phase includes logic to verify the erasing by sequentially testing a multibit segment and proceeding to a next multibit segment until the erasing of the block is verified, and wherein the third checkpoint enables the interrupting after testing of a multibit segment and before proceeding to a next multibit segment.

8. The integrated circuit memory of claim 1, including control logic to execute a read access to a block in the plurality of blocks other than the selected block, between the interrupting of the erase procedure and the returning to the erase procedure.

9. The integrated circuit memory of claim 1, wherein the memory array comprises a plurality of global bit lines;

a plurality of sets of block select transistors, each set of block select transistors coupled to a corresponding global bit line in the plurality of global bit lines;

a plurality of sets of local bit lines, each set of local bit lines coupled to a corresponding global bit line through a corresponding set of block select transistors, wherein memory cells in the array have drain terminals coupled to a local bit line in the plurality of sets of local bit lines;

a plurality of sets of local source lines, each set of local source lines coupled to a corresponding set of local bit lines through memory cells in the array, and coupled to a source potential supply circuit; and a plurality of word lines coupled to memory cells in the array;

wherein a block in said plurality of blocks of floating gate cells in the array includes a plurality of columns of memory cells, columns in the plurality of columns being coupled to a subset consisting of less than all of the local bit lines in a particular set of local bit lines coupled to a particular global bit line.

10. The integrated circuit memory of claim 9, wherein there are two local bit lines in the plurality of sets of local bit lines coupled to each local source line in the plurality of sets of local source lines.

11. The integrated circuit memory of claim 9, wherein there are two sets of local bit lines coupled to each global bit line in the plurality of local bit lines.

12. The integrated circuit memory of claim 11, wherein there are two local bit lines in the plurality of sets of local bit lines coupled to each local source line in the plurality of sets of local source lines.

13. The integrated circuit memory of claim 1, including another checkpoint enabling the interrupting between the precondition phase and the erase phase of the block erase procedure.

14. The integrated circuit memory of claim 1, including another checkpoint enabling the interrupting after applying the erase pulse and before verifying of the block in the erase phase of the block erase procedure.

15. The integrated circuit memory of claim 1, including a fourth checkpoint enabling the interrupting between the precondition phase and the erase phase of the block erase procedure, and a fifth checkpoint enabling the interrupting after applying the erase pulse and before verifying of the block in the erase phase of the block erase procedure.

16. An integrated circuit memory device, comprising:

a memory array, the memory array including a plurality of bit lines, and a plurality of blocks of floating gate memory cells coupled to the plurality of bit lines, wherein blocks in the plurality of blocks include a plurality of multibit segments of data, and at least two blocks in the plurality of blocks are coupled to a single set of bit lines in the plurality of bit lines;

block erase logic coupled to the memory array, which executes a block erase procedure to erase selected blocks of memory cells in response to a block erase command, the block erase procedure including a precondition phase, in which a selected block is pre-programmed by sequentially applying a program potential to a multibit segment, verifying the pre-programming of the multibit segment, and proceeding to a next multibit segment in the block until the block is pre-programmed, and an erase phase, in which the selected block is erased by applying an erase potential to the block, and then erasing of the block is verified by sequentially testing the multibit segments in the block; and erase suspend logic coupled to the block erase logic which executes an erase suspend procedure to suspend the block erase procedure in response to an erase suspend command and a resume command, the erase suspend procedure including interrupting the block erase procedure after receiving the erase suspend command during a checkpoint in a set of checkpoints in the block erase procedure, the set comprising a first checkpoint enabling the interrupting after applying a program potential to a multibit segment and before verifying the pre-programming of the multibit segment, a second checkpoint enabling the interrupting during applying the erase potential, and a third check point enabling the interrupting during verifying the erasing, and returning to the block erase procedure in response to a resume command.

17. The integrated circuit memory of claim 16, wherein the third checkpoint enables the interrupting after testing of a multibit segment and before proceeding to a next multibit segment.

18. The integrated circuit memory of claim 16, including control logic to execute a read access to a block in the plurality of blocks other than the selected block, between the interrupting of the block erase procedure and the returning to the block erase procedure.

19. The integrated circuit memory of claim 16, wherein the memory array comprises:
   a plurality of sets of block select transistors, each set of block select transistors coupled to a corresponding global bit line in the plurality of global bit lines;
   a plurality of sets of local bit lines, each set of local bit lines coupled to a corresponding global bit line through a corresponding set of block select transistors, wherein memory cells in the array have drain terminals coupled to a local bit line in the plurality of sets of local bit lines;
   a plurality of sets of local source lines, each set of local source lines coupled to a corresponding set of local bit lines through memory cells in the array, and coupled to a source potential supply circuit; and
   a plurality of word lines coupled to memory cells in the array;
   wherein a block in said plurality of blocks of floating gate cells in the array includes a plurality of columns of memory cells, columns in the plurality of columns being coupled to a subset consisting of less than all of the local bit lines in a particular set of local bit lines coupled to a particular global bit line.

20. The integrated circuit memory of claim 19, wherein there are two local bit lines in the plurality of sets of local bit lines coupled to each local source line in the plurality of sets of local source lines.

21. The integrated circuit memory of claim 19, wherein there are two sets of local bit lines coupled to each global bit line in the plurality of local bit lines.

22. The integrated circuit memory of claim 21, wherein there are two local bit lines in the plurality of sets of local bit lines coupled to each local source line in the plurality of sets of local source lines.

23. The integrated circuit memory of claim 16, including another checkpoint between the precondition phase and the erase phase of the block erase procedure.

24. The integrated circuit memory of claim 16, including another checkpoint after applying the erase pulse and before verifying of the block in the erase phase of the block erase procedure.

25. The integrated circuit memory of claim 16, including a fourth checkpoint between the precondition phase and the erase phase of the block erase procedure, and a fifth checkpoint after applying the erase pulse and verifying of the block in the erase phase of the block erase procedure.

26. An integrated circuit memory, comprising:
   a memory array, the memory array including a plurality of blocks of floating gate memory cells;
   block erase logic coupled to the memory array, including a plurality of block erase flags indicating blocks in the plurality of blocks to be erased and an erase retry counter which indicates a number of erase attempts have been executed, and which executes a block erase procedure to erase selected blocks of memory cells as indicated by the plurality of block erase flags in response to a block erase command, the block erase procedure including
      a precondition phase, in which a selected block is pre-programmed by applying a program potential, and then pre-programming of the block is verified, and
      an erase phase, in which blocks having set block erase flags are erased by applying an erase potential, and then erasing of the blocks having set block erase flags are verified in a sequence, and if a current block in the sequence is successfully erased, the block erase flag for the current block is reset, and then retrying the erase stage if any flags remain set after the sequence is complete; and
   erase suspend logic coupled to the block erase logic which executes an erase suspend procedure to suspend the block erase procedure in response to an erase suspend command, the erase suspend procedure including
      interrupting the block erase procedure after receiving the erase suspend command during a checkpoint in a set of checkpoints in the block erase procedure, the set comprising a first checkpoint enabling the interrupting during the precondition phase, a second checkpoint enabling the interrupting during applying the erase potential, and a third checkpoint enabling the interrupting during verifying the erasing, and if the interrupting occurs during the verifying of the erasing or during applying of the erase potential, the block erase flag of the current block and of all following blocks in the sequence are not reset, and
      returning to the block erase procedure without resetting the erase retry counter.

27. The integrated circuit memory of claim 26, wherein the first checkpoint enables the interrupting after applying said program potential and before verifying the pre-programming.

28. The integrated circuit memory of claim 26, wherein blocks in the plurality of blocks include a plurality of multibit segments of data, and said precondition phase includes logic to pre-program said selected block by multibit segment, by sequentially applying a program potential to a multibit segment, verifying the pre-programming of the multibit segment, and proceeding to a next multibit segment in the block until the block is pre-programmed, and wherein the first checkpoint is between the pre-programming of multibit segments.

29. The integrated circuit memory of claim 26, wherein blocks in the plurality of blocks include a plurality of multibit segments of data, and said precondition phase includes logic to pre-program a selected block by multibit segment, by sequentially applying a program potential to a multibit segment, verifying the programming of the multibit segment, and proceeding to a next multibit segment in the block until the block is pre-programmed, and wherein the first checkpoint enables the interrupting after application of a program potential to a multibit segment and before the verification of the programming of the multibit segment.

30. The integrated circuit memory of claim 26, wherein blocks in the plurality of blocks include a plurality of multibit segments of data, and said erase phase includes logic to apply an erase potential to the plurality of multibit segments, and wherein the second checkpoint enables the interrupting during applying of the erase potential.

31. The integrated circuit memory of claim 26, wherein blocks in the plurality of blocks include a plurality of multibit segments of data, and said erase phase includes logic to verify the erasing by sequentially testing a multibit segment and proceeding to a next multibit segment until the erasing of the block is verified, and wherein the third checkpoint enables the interrupting between testing of multibit segments.

32. The integrated circuit memory of claim 26, wherein blocks in the plurality of blocks include a plurality of multibit segments of data, and said erase phase includes logic to verify the erasing by sequentially testing a multibit segment and proceeding to a next multibit segment until the erasing of the block is verified, and wherein the third checkpoint enables the interrupting after testing of a multibit segment and before proceeding to said next multibit segment.

33. The integrated circuit memory of claim 26, including control logic to execute a read access to a block in the plurality of blocks other than the selected block, between the interrupting of the erase procedure and the returning to the erase procedure.

34. The integrated circuit memory of claim 26, wherein the memory array comprises a plurality of global bit lines;

a plurality of sets of block select transistors, each set of block select transistors coupled to a corresponding global bit line in the plurality of global bit lines;

a plurality of sets of local bit lines, each set of local bit lines coupled to a corresponding global bit line through a corresponding set of block select transistors, wherein memory cells in the array have drain terminals coupled to a local bit line in the plurality of sets of local bit lines;

a plurality of sets of local source lines, each set of local source lines coupled to a corresponding set of local bit lines through memory cells in the array, and coupled to a source potential supply circuit; and a plurality of word lines coupled to memory cells in the array;

wherein a block in said plurality of blocks of floating gate cells in the array includes a plurality of columns of memory cells, columns in the plurality of columns being coupled to a subset consisting of less than all of the local bit lines in a particular set of local bit lines coupled to a particular global bit line.

35. The integrated circuit memory of claim 34, wherein there are two local bit lines in the plurality of sets of local bit lines coupled to each local source line in the plurality of sets of local source lines.

36. The integrated circuit memory of claim 34, wherein there are two sets of local bit lines coupled to each global bit line in the plurality of local bit lines.

37. The integrated circuit memory of claim 36, wherein there are two local bit lines in the plurality of sets of local bit lines coupled to each local source line in the plurality of sets of local source lines.

38. The integrated circuit memory of claim 26, including another checkpoint between the precondition phase and the erase phase of the block erase procedure.

39. The integrated circuit memory of claim 26, including another checkpoint after applying the erase pulse and before verifying of the block in the erase phase of the block erase procedure.

40. The integrated circuit memory of claim 26, including a fourth checkpoint between the precondition phase and the erase phase of the block erase procedure, and a fifth checkpoint after applying the erase pulse and verifying of the block in the erase phase of the block erase procedure.

* * * * *